United States Patent [19] [11] Patent Number: 4,987,678
Satterfield et al. [45] Date of Patent: Jan. 29, 1991

[54] APPARATUS FOR INSTALLING WIRE IN GRID SUPPORT STRUCTURE

[75] Inventors: Nathaniel J. Satterfield, Anderson, S.C.; James D. Struttmann, Indialantic, Fla.

[73] Assignee: Harris Corporation, Melbourne, Fla.

[21] Appl. No.: 326,745

[22] Filed: Mar. 21, 1989

[51] Int. Cl.⁵ ........................ H01R 43/04; B23P 23/00
[52] U.S. Cl. ................................ 29/868; 29/564.4; 29/825; 29/850; 228/4.5; 228/179
[58] Field of Search ................. 29/850, 868, 745, 748, 29/825, 564.4, 564.6, 564.8; 228/4.5, 179

[56] References Cited

U.S. PATENT DOCUMENTS

| | | | |
|---|---|---|---|
| 3,114,194 | 12/1963 | Lohs | 29/850 |
| 4,031,612 | 6/1977 | Nicolas | 29/850 |
| 4,337,573 | 7/1982 | Nicolas et al. | 228/179 X |
| 4,437,603 | 3/1984 | Kobayashi et al. | 29/850 X |
| 4,693,778 | 9/1987 | Swiggett et al. | 29/850 X |

FOREIGN PATENT DOCUMENTS

| | | | |
|---|---|---|---|
| 608280 | 4/1978 | U.S.S.R. | 29/850 |
| 2120152 | 11/1983 | United Kingdom | 29/850 |

Primary Examiner—Carl E. Hall
Assistant Examiner—Carl J. Arbes
Attorney, Agent, or Firm—Evenson, Wands, Edwards, Lenahan & McKeown

[57] ABSTRACT

A robotically controlled wiring apparatus for stripping, cutting and installing clad wire in a waffleline plate supported on an X-Y table comprises a wire feed, stripping and cutting unit, which is displaceable toward and away from the waffleline plate. The wire installation unit includes a clamp foot that is controlled by a cam unit to engage the wire and urge a first end of the wire into a channel of the waffleline plate. After the clamp foot has been retracted away from an inserted end of wire and the installation wheel is positioned against the wire, the X-Y table is translated, causing the wheel to rotate, drawing wire from a supply spool and effectively press-fitting the wire along the channel of the waffleline plate. After a prescribed length of wire has been installed, the wire is stripped and cut. For this purpose, the wire is clamped in the channel and placed in tension. The insulation-stripping and wire-cutting unit is displaced along the tensioned wire to a location where the portion of the wire to be stripped will be impinged by a multipath laser beam. A cladding-stripping laser beam is then directed onto the portion of the cladding to be stripped, so that cladding material is vaporized off the wire. The wire-cutting unit is translated down the wire until the cutting unit surrounds the stripped portion of the wire. The wire is then cut by rotating a shear element across an aperture in a cutting anvil of the cutting unit.

44 Claims, 22 Drawing Sheets

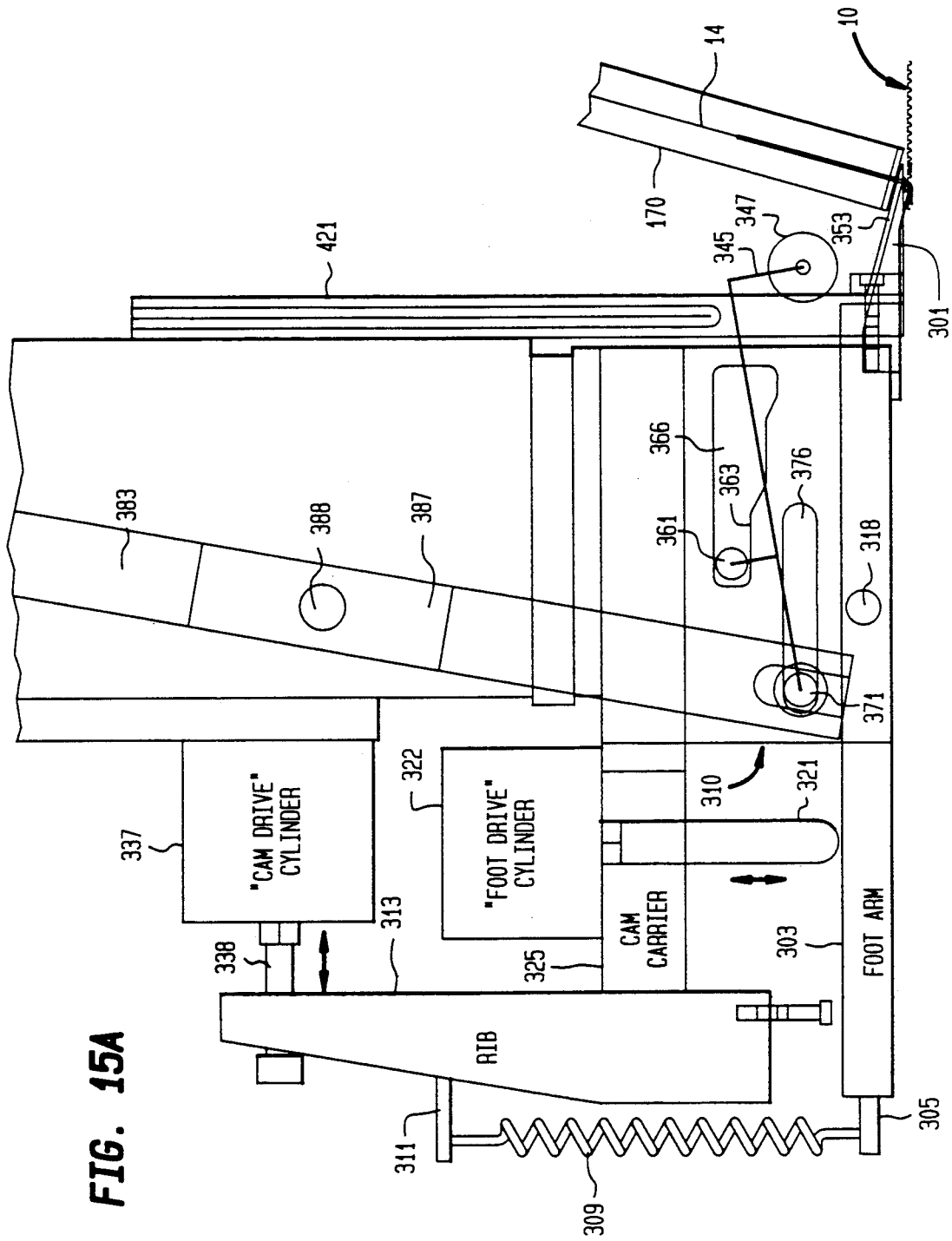

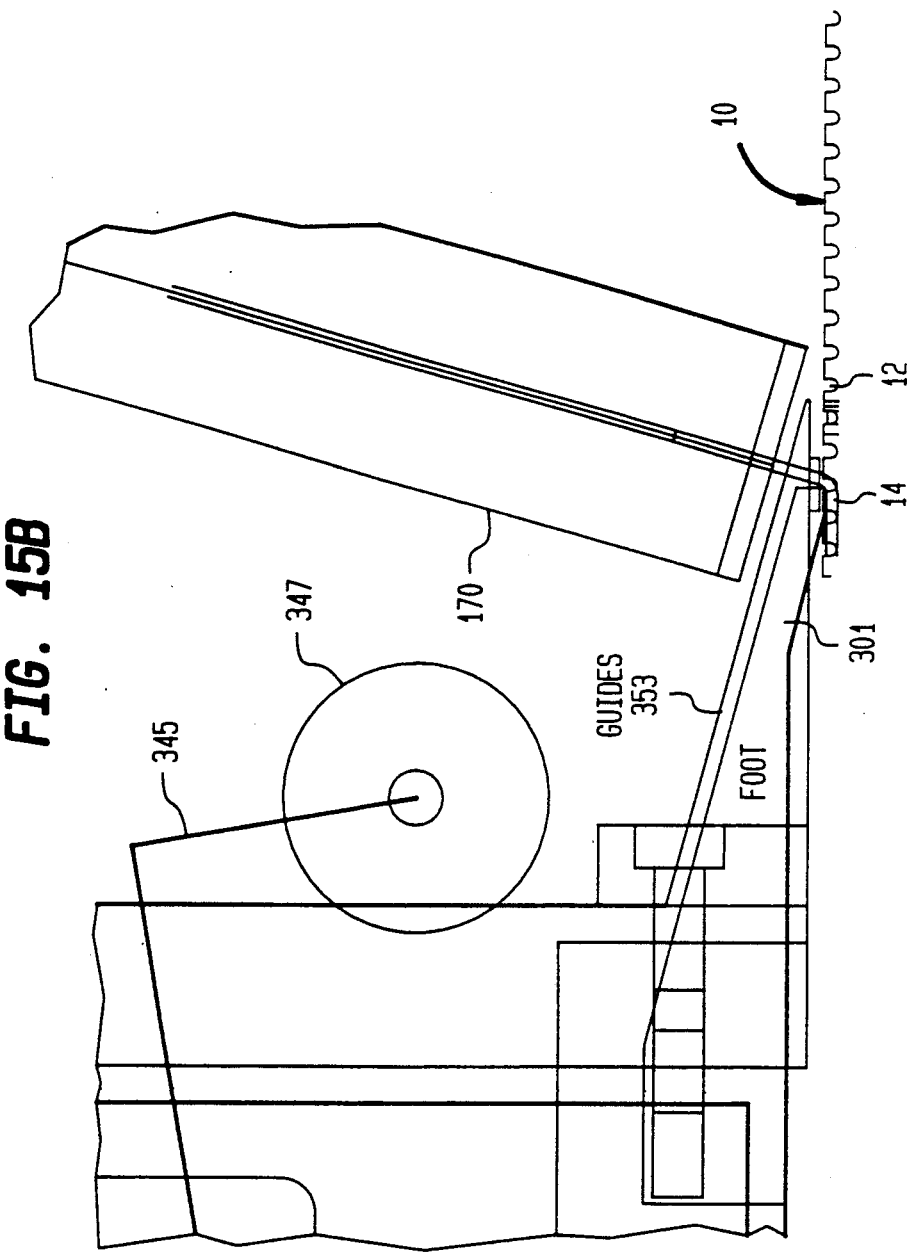

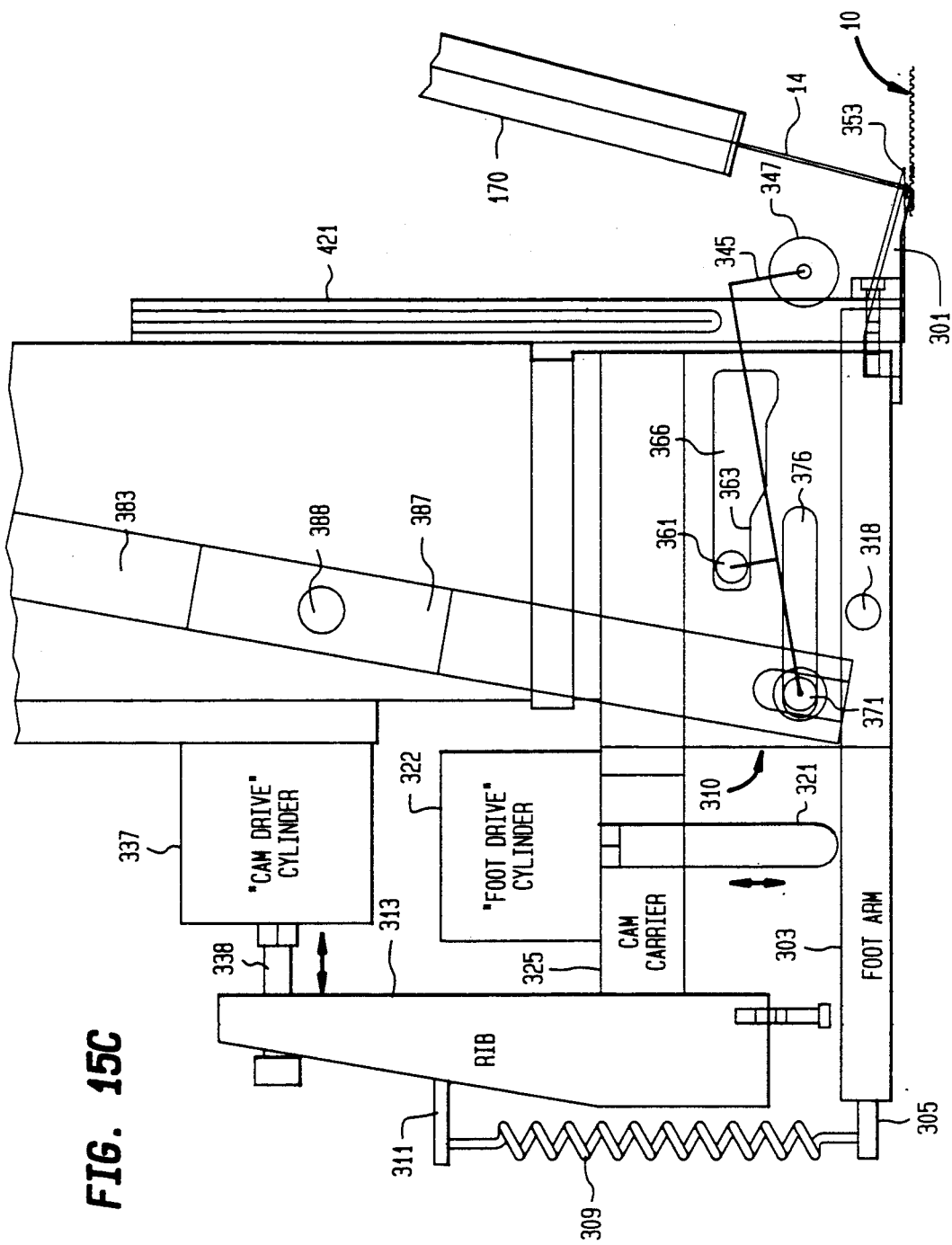

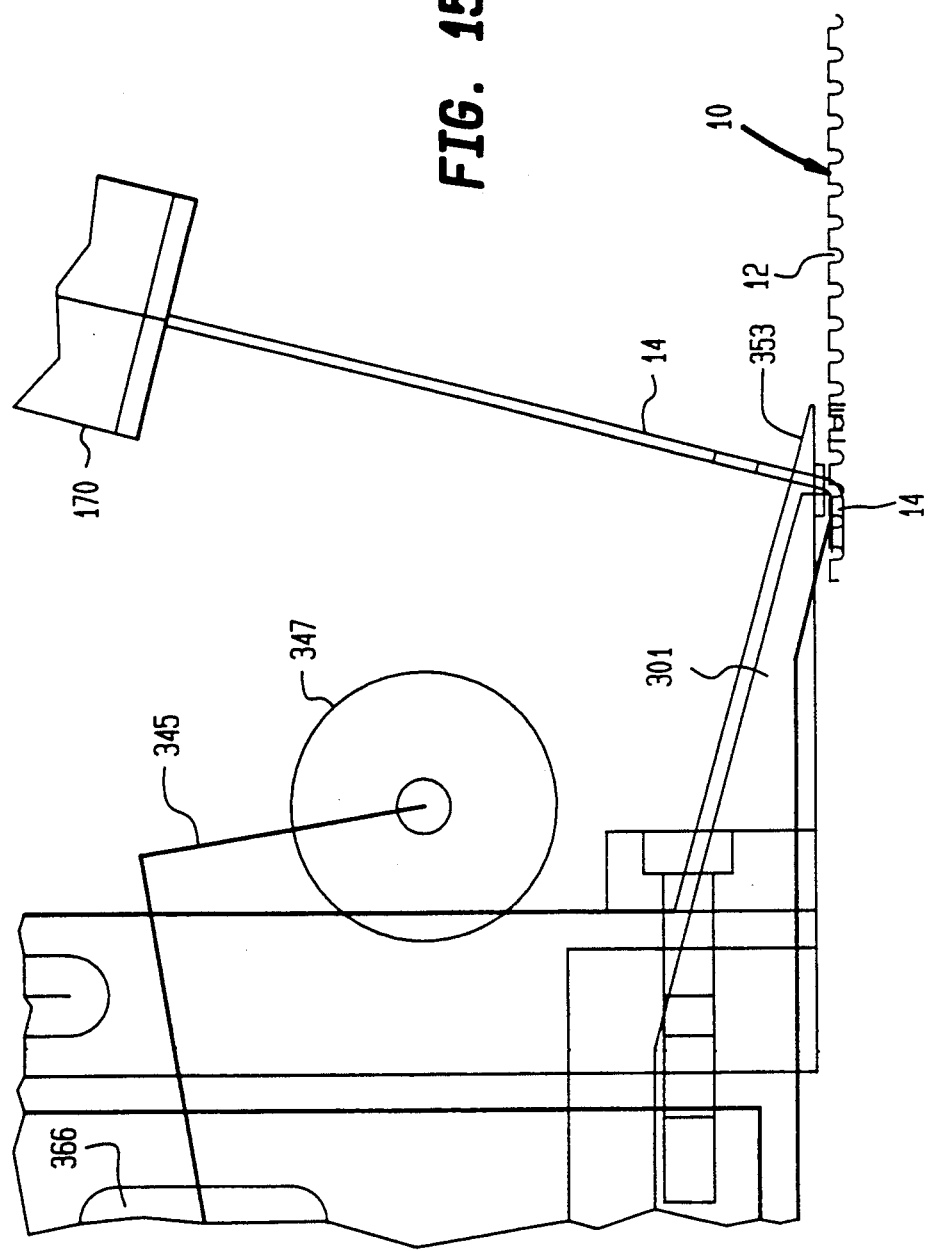

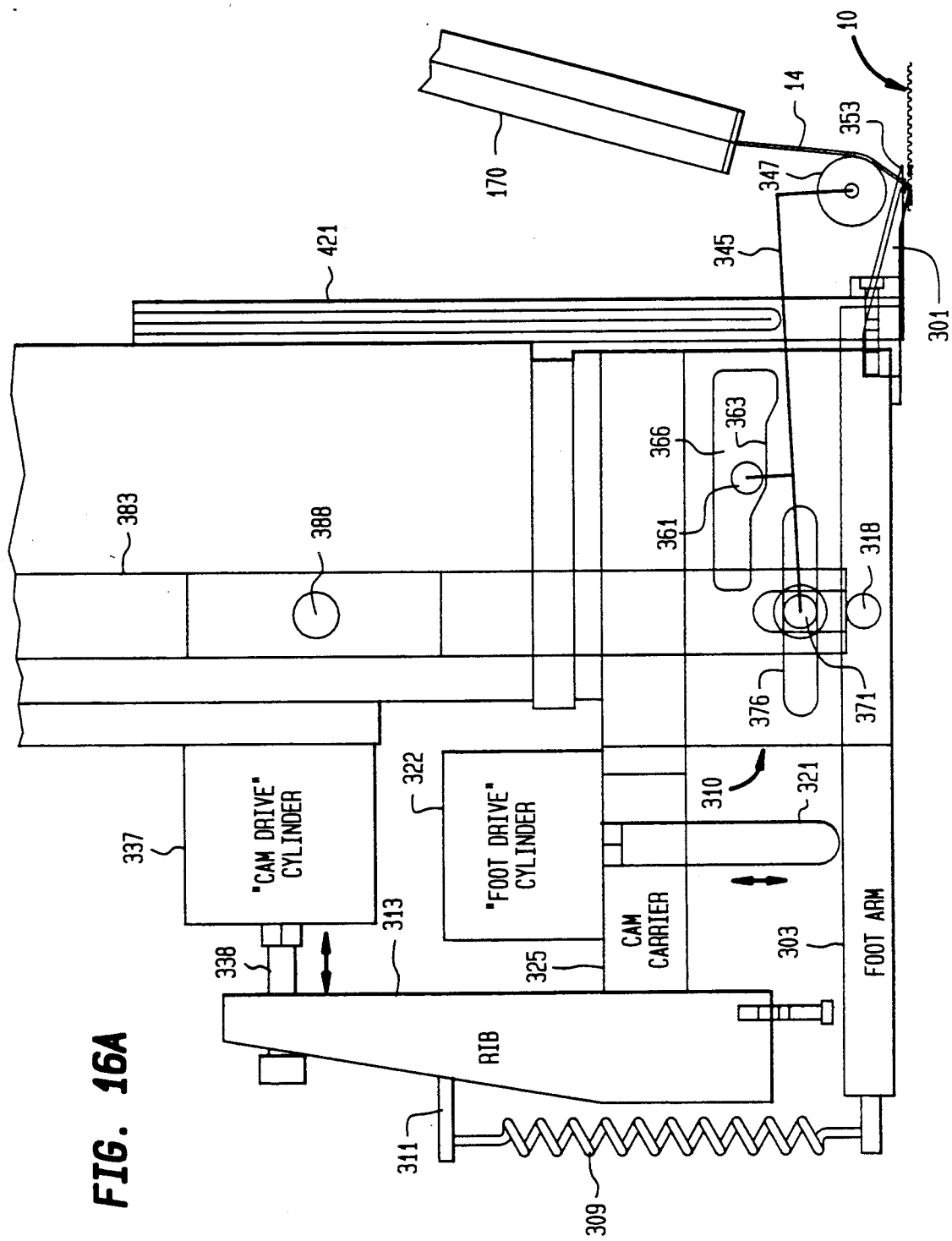

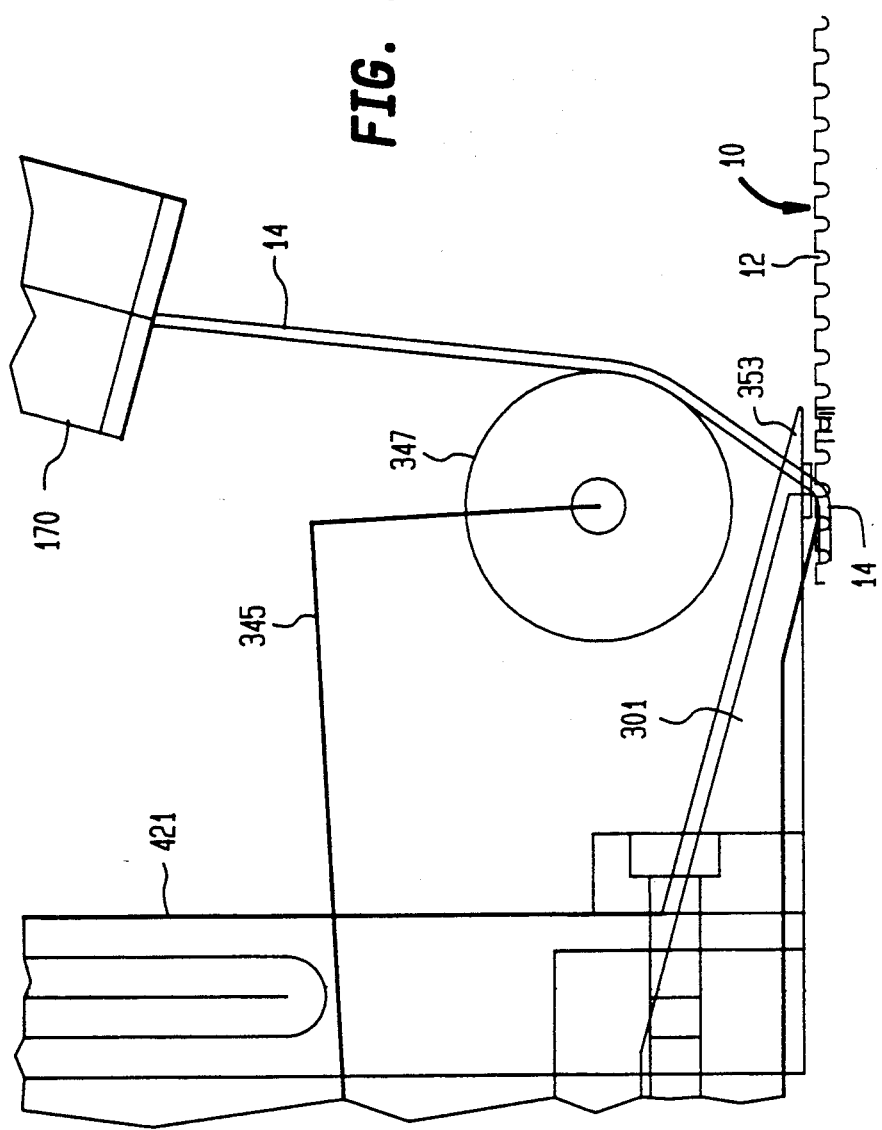

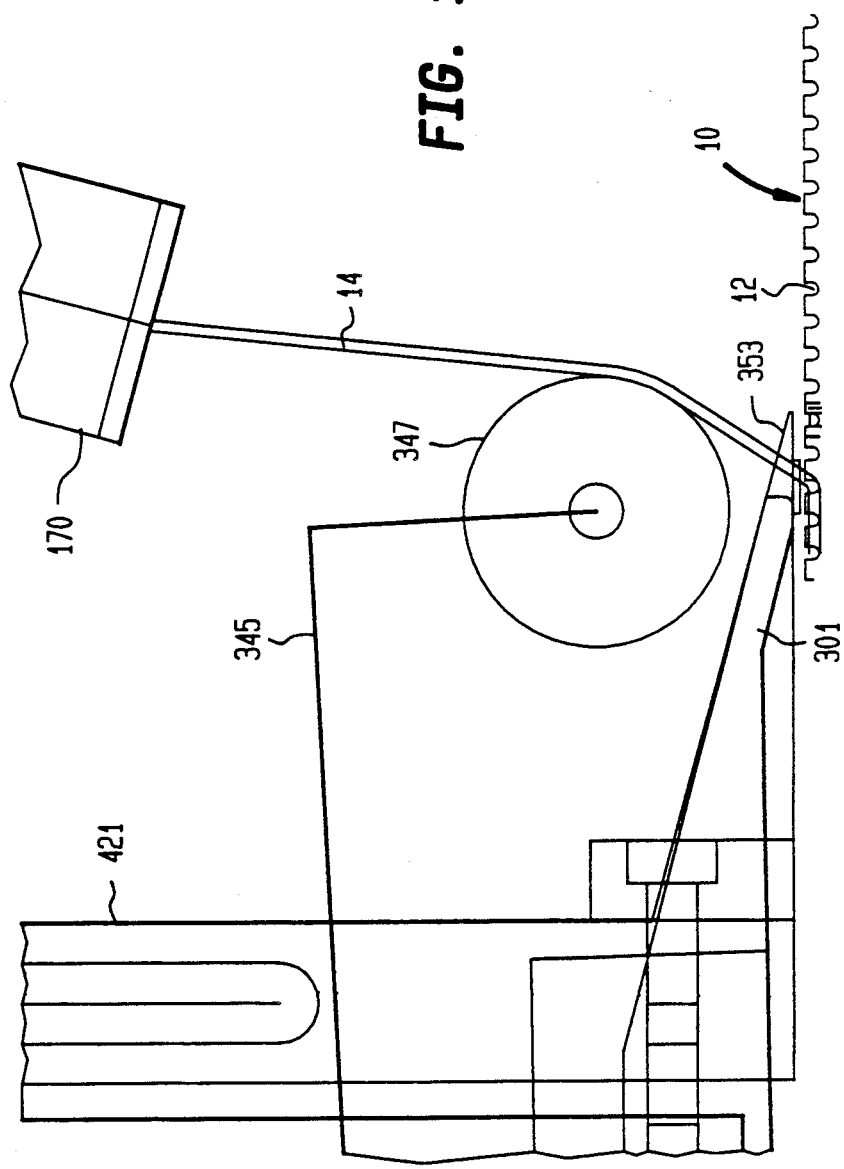

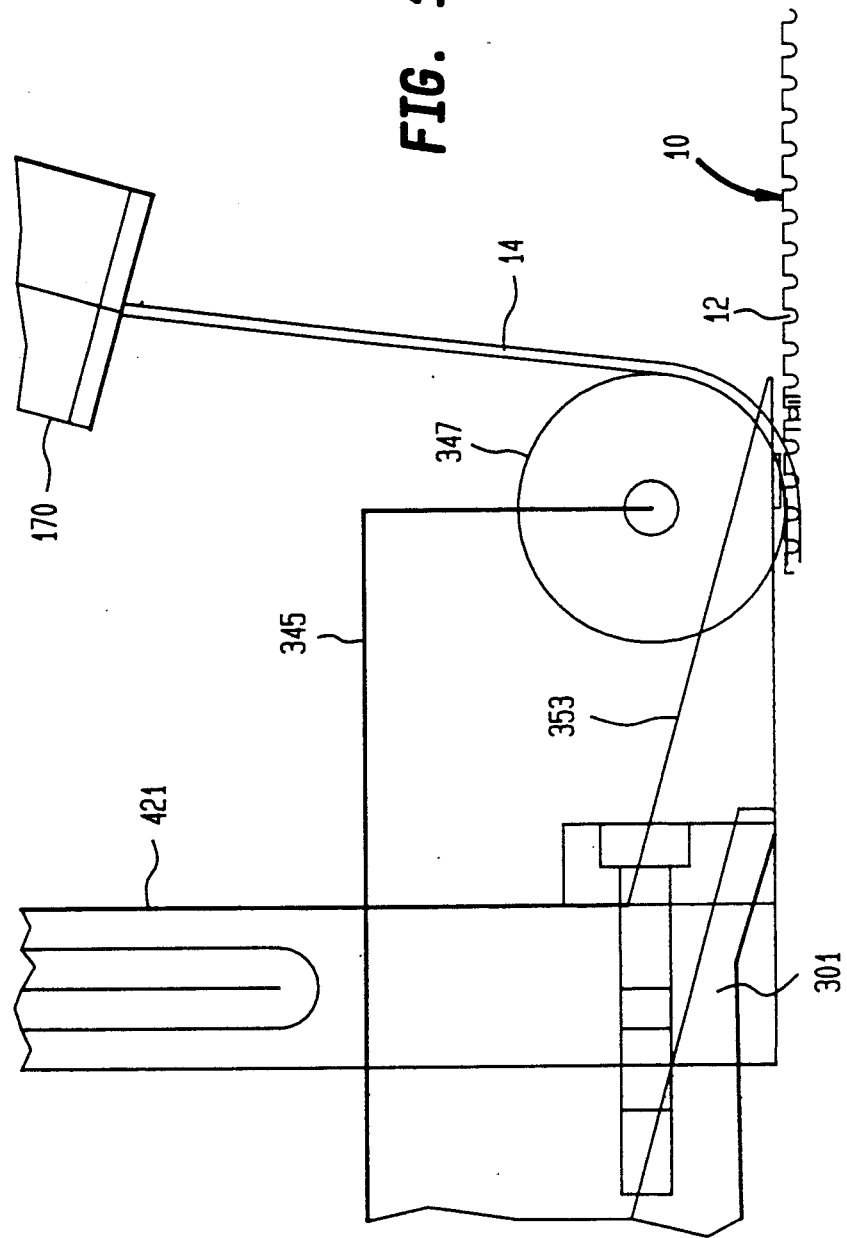

ial, issued Sept. 22, 1987 and assigned to the Assignee of

APPARATUS FOR INSTALLING WIRE IN GRID SUPPORT STRUCTURE

FIELD OF THE INVENTION

The present invention relates in general to an apparatus for installing wire in a circuit interconnect support structure and is particularly directed to a robotic system for controllably stripping, cutting and installing continuous clad cable into support grooves or channels of a matrix or grid fixture, such as a MMIC-supporting waffleline plate.

BACKGROUND OF THE INVENTION

The miniaturization and packaging of electrical and electronic circuit components, particularly those intended for millimeter and microwave applications, such as GaAs monolithic integrated circuit devices, has led to the need for an associated interconnect structure, which not only acts as a support fixture for the various building blocks of an overall signal processing system, but contains the requisite (transmission line) interconnect between components. One particularly useful structure that has been developed for this purpose is described in U.S. Pat. No. 4,695,810 to D. Heckaman et al, issued Sept. 22, 1987 and assigned to the Assignee of the present application. This patented transmission line/support fixture, termed 'waffleline', is similar in appearance to the structure of a waffle iron, in that it is comprised of a conductive plate whose surface is configured as an array of mesas separated from one another by a gridwork of troughs or channels. The 'waffleline' plate may also contain pockets, recessed areas or apertures in which MMIC components are supported, connections among which are effected by installing insulated wires along the channels. In its installed condition, a length of insulation-clad wire serves as the center conductor of a periodic transmission line, the characteristic impedance of which (e.g. 50 ohms) is established by the dimensional spacing and sizes of the channels and mesas of the plate, which also forms the ground plane of the transmission line. Because the operational frequency of the components supported by a 'waffleline' plate is in the multi (tens of) GHz range, both the size of the center conductor (e.g. 0.021 inch diameter wire) and the channel spacing between mesas (0.025 inches channel width and depth, corresponding to a period of 50 mils) are extremely small, placing a significant precision requirement on the process through which the center conductor is installed in the channels of the waffleline.

SUMMARY OF THE INVENTION

In accordance with the present invention, the above-referenced extremely narrow tolerances and 'tight cornered' configuration of a MMIC-supporting waffleline structure are successfully addressed by means of a practical automated wire installation scheme for use in real time manufacturing and assembly, which includes a robotically controlled wiring apparatus that is capable of stripping, cutting and installing continuous, clad conductor, so as to achieve point-to-point transmission line connectivity over any X-Y channel path of a waffleline plate. For this purpose, the present invention comprises an X-Y table upon which the waffleline plate is placed for two-dimensional translation, as wire is installed by an adjacent feeding mechanism along a prescribed channel path. Adjacent to the X-Y table is a first, wire feed, stripping and cutting unit, which is displaceable toward and away from a waffleline plate that has been mounted on the X-Y table. This first unit contains a wire feed mechanism through which wire is fed incrementally or drawn freely over a wire feed path which passes through a stripping and cutting unit into a channel of the waffleline plate.

The wire installation unit includes a clamp foot that is controlled by a cam unit to engage the wire and urge a first end of the wire into a channel of the waffleline plate (while an associated installation wheel is retracted by the cam unit). When operated, the cam unit alternately brings one of the installation wheel and the clamp foot into engagement with the wire that has been fed to the waffleline, while retracting the other of the wheel and the clamp foot from the wire. Once the clamp foot has been retracted away from an inserted end of wire and the installation wheel is positioned against the wire, the X-Y table is translated toward the installation wheel causing the wheel to rotate, drawing wire from a supply spool and effectively press-fitting the wire down along the channel of the waffleline plate.

After a prescribed length of wire (travsersing only a single straight path or a multiple piece-wise linear, meandering path) has been installed in a channel of the waffleline plate (during translation of the X-Y table), the wire is stripped and cut. For this purpose, the cam unit is operated to retract the wheel and extend the clamp foot, so that the wire is clamped in the channel. The wire is then placed in tension by clamping and tensioning another end of the wire adjacent to the supply spool. The insulation-stripping and wire-cutting unit is displaced along the tensioned wire to a location where the portion of the wire to be stripped will be impinged by a multipath laser beam. A cladding-stripping laser beam is then directed onto the portion of the cladding to be stripped, so that cladding material is vaporized off the wire. The installation wheel is again engaged to draw the wire into the channel until the stripped portion of the wire is coincident with a location adjacent to the surface of the waffleline plate where the wire is to be cut. The wire is once again placed in tension and the wire-cutting unit is translated down the wire until the cutting unit surrounds the stripped portion of the wire. The wire is then cut by rotating a shear element across an aperture in a cutting anvil of the cutting unit through which the stripped wire passes.

During installation of the wire over a meandering path, turns are effected by preshaping or kinking the wire at the point of the turn. For this purpose, whenever a turn is encountered, the wire is clamped in the channel at the point of the turn and then tensioned outside the channel. When the tension is released and the clamp foot retracted, the wire contains a twist or kink that facilitates compliance with the turn. The robotic manipulator upon which the cutting and installation units are mounted is rotated to the new direction and the wire installation procedure carried out in the new channel.

BRIEF DESCRIPTION OF THE DRAWINGS

FIGS. 13–20 show enlarged partial views of portions of the wire installation apparatus of the present invention during respective stages of translation of the system and manipulation of the wire in the course of its installation in a waffleline channel.

DETAILED DESCRIPTION

Before describing the details of the robotically controlled wire installation apparatus of the present invention it is initially useful to examine the configuration of a wire support structure with which the present invention is intended to be used. For purposes of the present discussion, that structure will be assumed to contain a gridwork of wire-receiving channels that are sized to accommodate a length or run of insulation clad conductor that is to be effectively press fit along a path (straight or meandering) traversing one or more channels within the gridwork, such as the patented 'waffleline' plate, referenced above. It should be understood, however, that the present invention is not limited to use only with such a 'waffleline' plate, but may be employed with a variety of cable/strand material support fixtures. What is required is that the support structure have one or more channels or grooves into which the wire may inserted, clamped and installed during translation of the support structure by an attendant positioning mechanism, such as an X-Y table.

Figure 1:
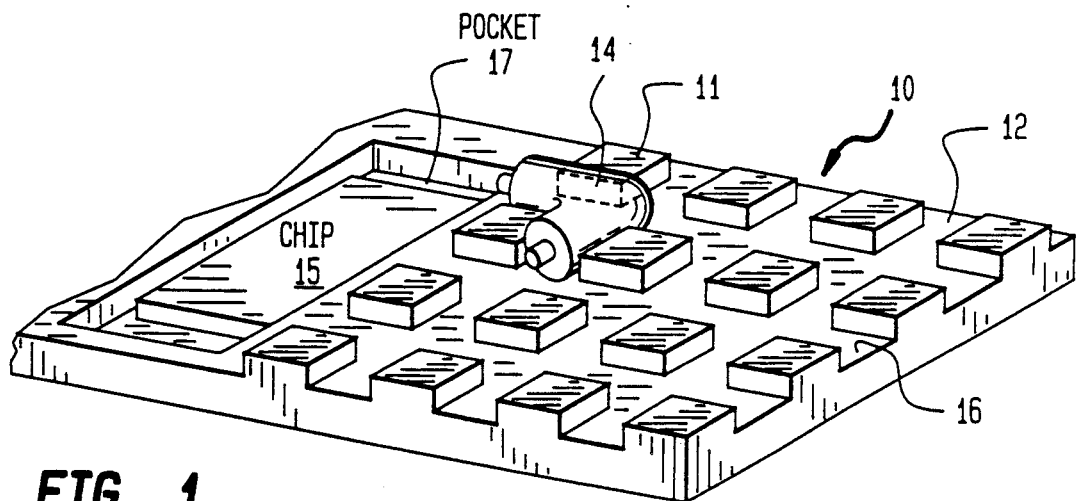
FIG. 1 pictorially shows a portion of a waffleline plate.

Referring now to FIG. 1, a portion of a 'waffleline' plate 10 is shown pictorially as comprising an array of mesa regions 11, mutually separated from one another by a gridwork of channels or troughs 12, from the floor or bottom 16 of which the mesas 11 extend, so that the waffleline plate closely resembles the configuration of a "waffle iron". For MMIC applications in a frequency range on the order of 10+ GHz, the dimensions of the 'waffleline' are extremely small (e.g. 25 mil channel width and depth and mesa period of 50 mils) and may accommodate a Teflon clad center conductor having a diameter on the order of 21 mils, as noted above. In addition, it can be expected that intersections of the channels will be required to support wiring cross-overs ('piggy-back', press-fitted wires extending in orthogonal directions), so that a precise, snug placement of the wire within a channel is essential for satisfying transmission line performance criteria. While placement of a length of wire 14 between spaced apart regions of the waffleline plate 10, such as between a MMIC chip 15 that has been captured in a recess or pocket 17 and a feed-through hole 18, may be carried out manually or semi-automatically, repeatability of an overall interconnect layout, such as one used for a phased array radar system, and efficiency of a practical manufacturing process require that the respective lengths of wire be installed by an automated process.

Figure 2:
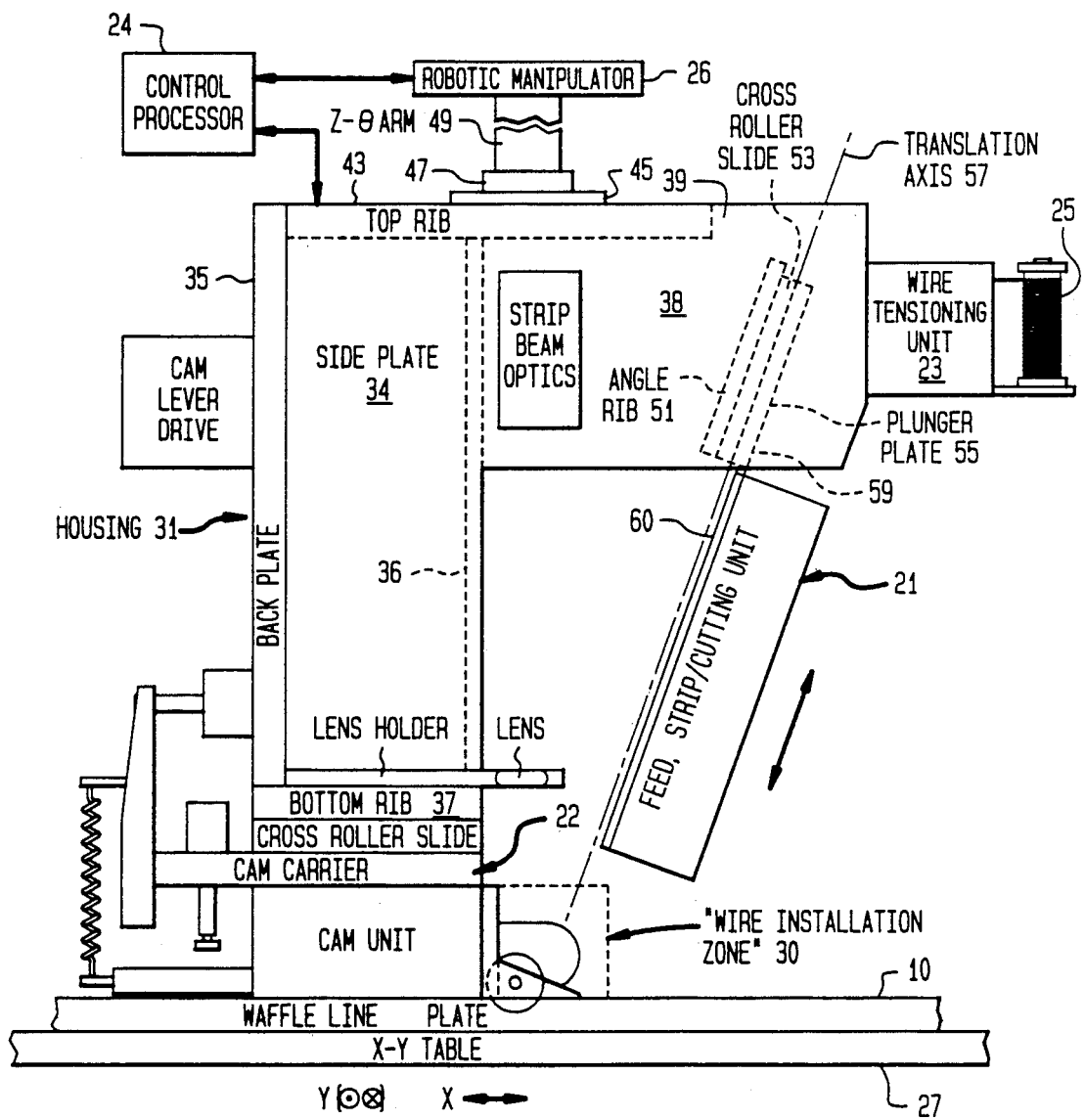
FIG. 2 is a diagrammatic side view of a robotically controlled wiring apparatus in accordance with an embodiment of the present invention.

Pursuant to the present invention, such a process is accomplished by means of a robotically controlled system, diagrammatically illustrated in FIG. 2 as comprising a set of wire manipulation units 21, 22 and 23 which are sequenced by an attendant system control processor 24 and are mounted in a support housing for Z-theta coordinate translation and rotation by a robotic manipulator 26 above an X-Y table. Each of control processor 24, robotic manipulator 26, and X-Y table 27 is a commercially available unit and, except where necessary to facilitate an understanding of the manner in which such units interface with the remainder of the system, the details thereof will not be described. The operational sequence of the automated wiring process that is implemented by the components of the system under processor control is, of course, detailed below. A source code listing of the wiring installation control program employed by processor 24 has been submitted as a separate appendix.

A first of the wiring manipulation units 21 controllably feeds, strips and cuts a continous strand or wire or cable 14, while the second unit 22 controllably clamps and installs the wire, as it is drawn from a supply spool 25. Between supply spool 25 and wire feed unit 21 is a third, wire-tensioning unit 23, which operates in conjunction with units 21 and 22 to controllably tension the wire, as necessary, during stripping and cutting operations and to impart a twist or kink to the wire whenever a turn in the installation path is encountered. Each of units 21 22 and 23 is supported above the waffleline plate 10 by means of a generally L-shaped housing 31, a top rib 33 of which is mounted between a pair of 'L'-shaped side plates 34 and affixed to a Z-theta motion robotic manipulator 26. The side plates 34 of housing 31 are also affixed to a vertically extending backplate 35, a vertical rib 36 and a bottom rib 37. Robotic manipulator 26 is positioned adjacent to (above) an X-Y table 27, on which the waffleline plate 10 is supported for two-dimensional translation, so that it may controllably vertically displace and rotate housing 31 and the wire manipulation units supported thereby as necessary to carry out piecewise-linear installation of wire in the channels of the waffleline plate. Thus, during the installation of a segment of wire along a path containing one or more channels of the plate, any portion of any channel 12 of the waffleline plate 10 may become what is diagrammatically shown by broken lines 30 as a 'wire installation zone' that is to be engaged by installation unit 22 and its associated feed and tensioning units 21 and 23 for the installation of wire.

Figure 3:
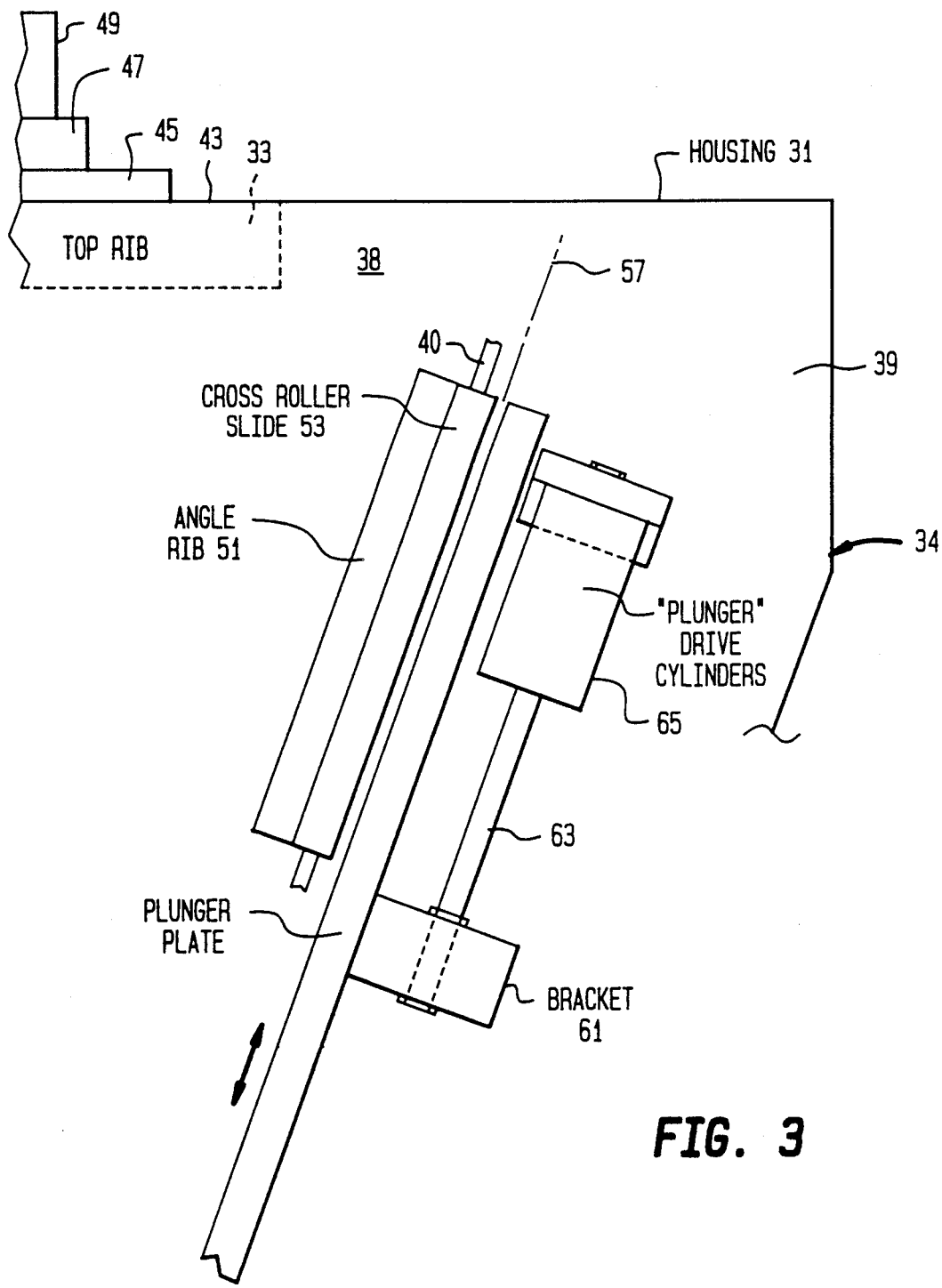
FIG. 3 is a diagrammatic side view of a feed, stripping and cutting unit 21 of FIG. 2.

With continued reference to FIG. 2 and referring also to FIG. 3, which is a diagrammatic side view of feed, stripping and cutting unit 21, at a forward or end mounting region 38 of the upper leg portion 39 of one of a pair of L-shaped side plates 34 of housing 31, each side plate 34 is affixed to opposite edge portions of a top rib 33, an upper face 43 of which is mounted by way of a bracket 45 to the lower end 47 of an arm 49 of Z-theta manipulator 26. Housing 31 includes additional ribs between side plates 34 to provide rigidity and support for the components of the wire manipulation units 21 and 22. One of these ribs is an angle rib 51, which is bolted between the opposite interior faces of side plates 34 and supports a cross-roller slide 53. A plunger plate 55 is mounted to cross-roller slide 5 for translating wire feed, stripping and cutting unit 21 along an inclined travel path 57 relative to the (horizontal) surface of X-Y table 27 (and thereby waffleline plate 10). Also, an upper wire guide tube 40 is arranged to traverse corss-roller slide 5 for guiding the wire to feed, strip/ cutting unit 21.

Bolted to the lower face 59 of plunger plate 55 is a generally longitudinally shaped rectangular bracket 61 that extends transverse to inclined travel path 57. Spaced apart (generally end) regions of of bracket 61 are attached to the output shafts 63 of respective 'plunger' drive cylinders 65, mounted to respective support brackets 67 on the outer sides of plates 34. Drive cylinders 65 and other drive cylinders of the apparatus to be described below are preferably conventional electropneumatic devices. Each of brackets 67 is mounted to a plate 34 such that the axis of a respective output shaft 63 is parallel to travel path 57. As a result, as 'plunger' drive cylinders 65 are operated to extend and withdraw shafts 63, bracket 61 and plunger plate 55 are translated downwardly and upwardly, respectively, along inclined travel path 57. Namely, it is through the controlled operation of 'plunger' drive cylinders 65 that wire feed unit 21 is translated with respect to wire installation zone 30.

Figure 4:
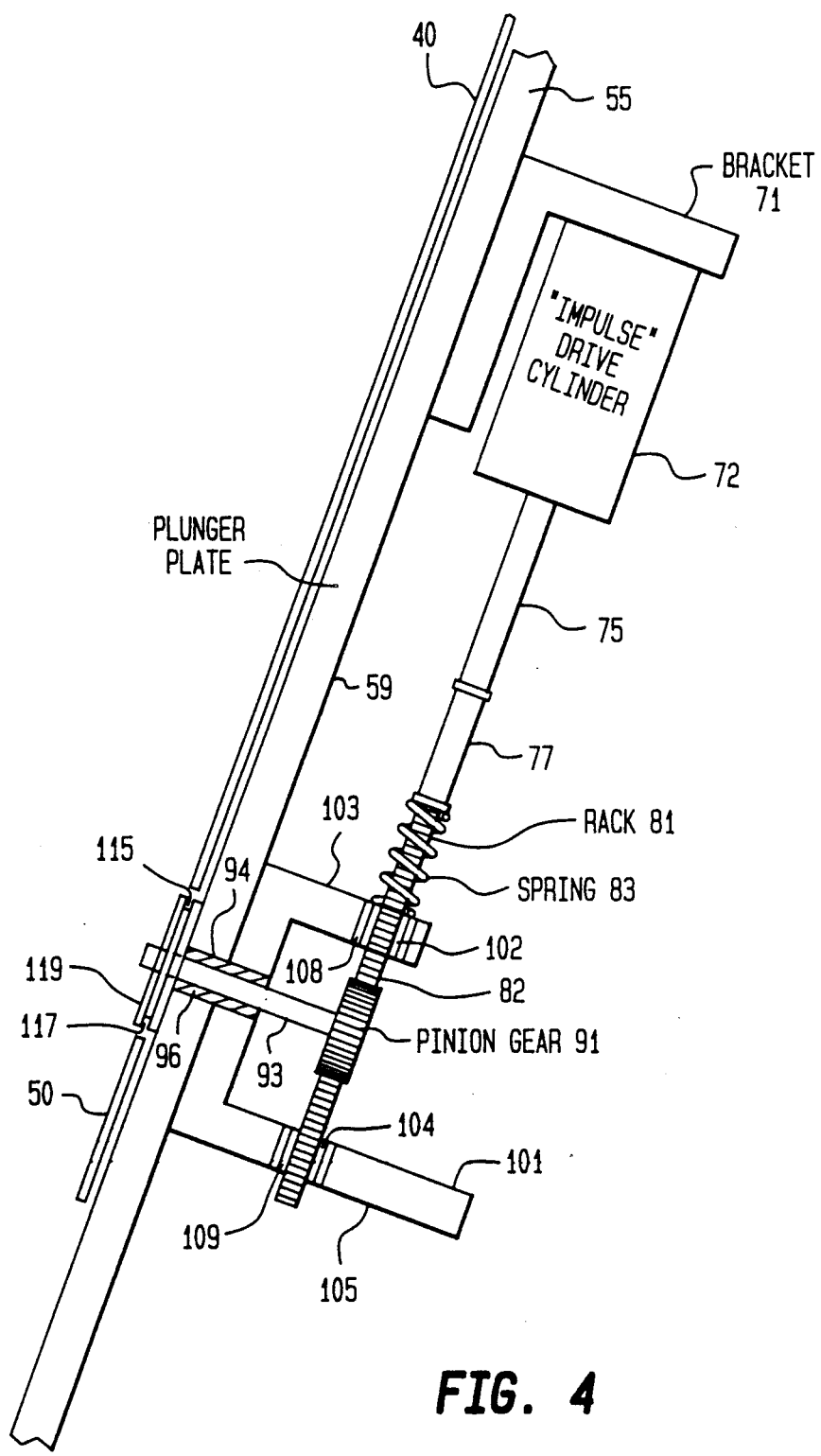
FIG. 4 shows a portion of the wire feed mechanism of unit 21 in detail.

Referring now to FIG. 4, a portion of the wire feed mechanism of unit 21 is shown in detail. Specifically, mounted to the lower face 59 of plunger plate 55 between opposing interior faces of side plates 34 is a bracket 71, which supports an 'impulse-feed' drive cylinder 72, the output shaft 75 of which is coupled, via a shaft extension 77, to one end of a rack 81 of a rack and pinion gear mechanism 82. A spring 83 keeps the upper end of rack 81 urged against shaft extension 77. Rack 81 engages pinion gear 91, which drives a shaft 93. Pinion gear shaft 93 is supported by a bearing race 94 within aligned apertures 96 in plunger plate 55 and a generally U-shaped gear block 101, which is also mounted to lower face 59 of plunger plate 55. Upper and lower portions 103 and 105 of gear block 101 have respective holes 102, 104 aligned with the axis 106 of rack 81, into which respective press bearings 108 and 109 are inserted for supporting rack 81 for axial translation and thereby rotation of pinion gear 91. A hub drive wheel 115 is press fitted on shaft 93 and abuts against bearing race 94. Also fitting onto shaft 93 are a drive disk 117 and an outer flange 119 The diameter of drive disk 117 is less than that of hub drive wheel 115 and outer flange 119, so as to form a stepped-V notch within which wire to be fed by drive wheel 115 may captured as an idler wheel engagement mechanism 120 urges an idler wheel 125 against disk 117 (shown in FIG. 5).

Figure 5:
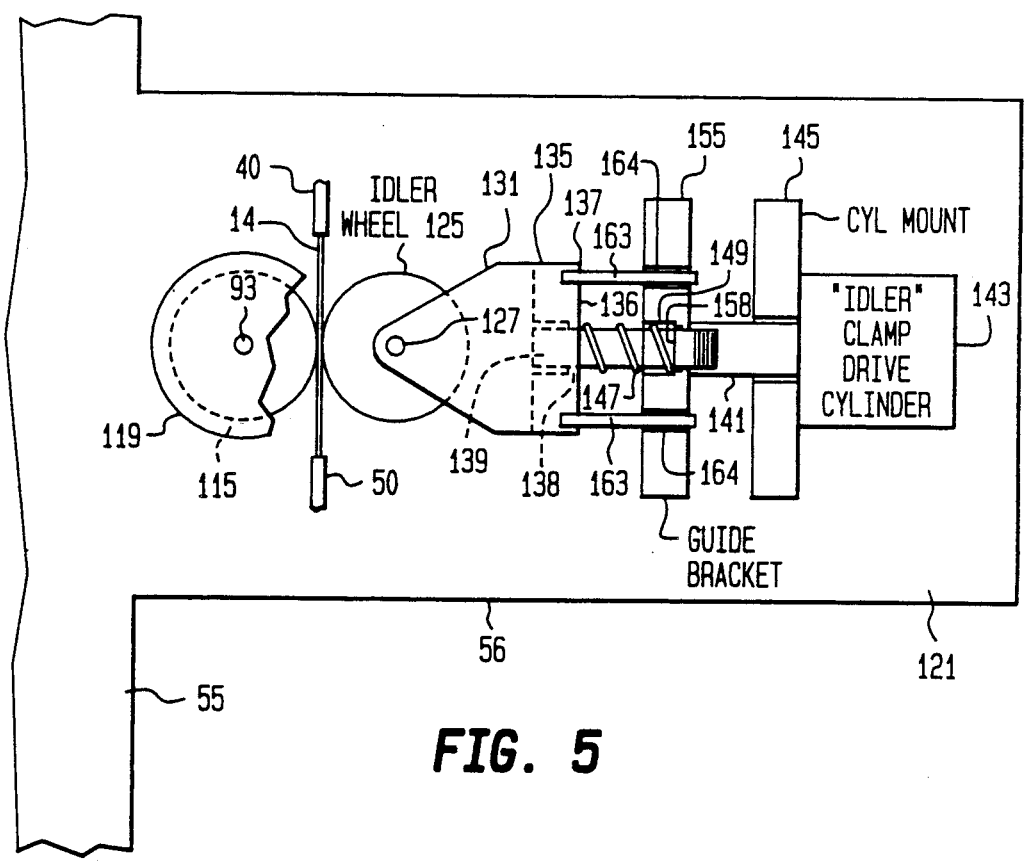
FIG. 5 shows the configuration of an idler wheel engagement mechanism.

The idler wheel engagement mechanism is shown in detail in FIG. 5, which is a diagrammatic front view of the upper face 121 of a wing portion 56 of plunger plate 55. Idler wheel 125 rotates about shaft 127 which is rotationally supported by spaced apart web portions 131 of an idler carrier 135. Idler carrier 135 has a base portion 137, through a central bore 138 in which a central shaft 139 extends for engagement with the output shaft 141 of an 'idler' drive cylinder 143 that is affixed to a cylinder mounting bracket 145. A compression spring 147 is captured within a bore 149 of a guide bracket 155, which is mounted in spaced apart relationship to cylinder mounting bracket 145. Opposite ends of spring 147 abut against the bottom surface 136 of the base portion 137 of idler carrier 135 and the base 158 of bore 149 within guide bracket 155, so as to normally bias or urge idler carrier 135 toward drive wheel 115, in order to frictionally capture therebetween a strand of wire 14 emerging from upper guide tube 40. The wire is then fed into a lower guide tube 50 located beneath wheels 115 and 125. The frictional engagement between the wheels is released by operating 'idler' drive cylinder 143, so as to translate or withdraw output shaft 141 against the action of spring 147. Idler carrier 135 is aligned for axial translation with shaft 139 by way of a pair of guide dowels 163, which are parallel with the axis of shaft 139 in carrier 135 and extend into press fit bushings 164 in guide bracket 155.

Figure 6:
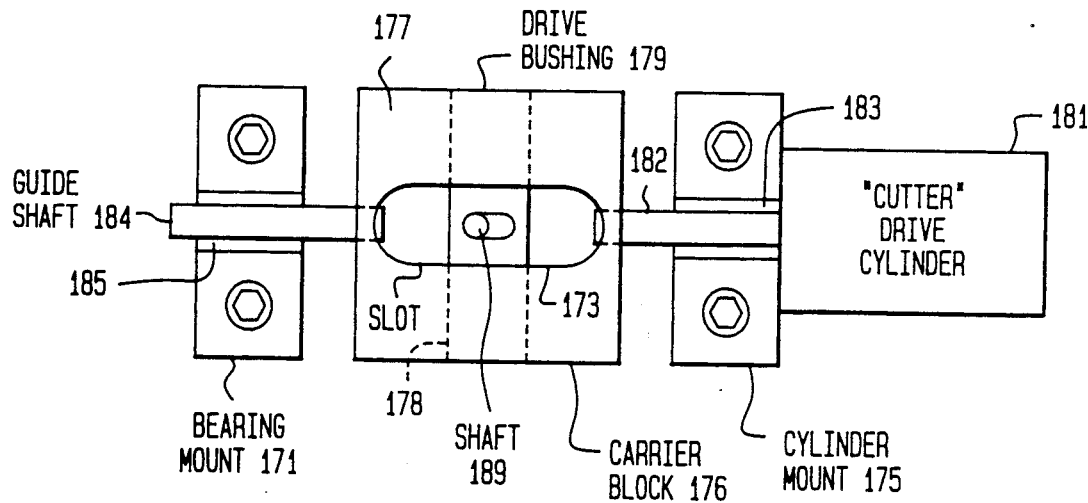
FIG. 6 is a front view and FIG. 7 is a side view of the drive components of cutting unit 170.
Figure 7:
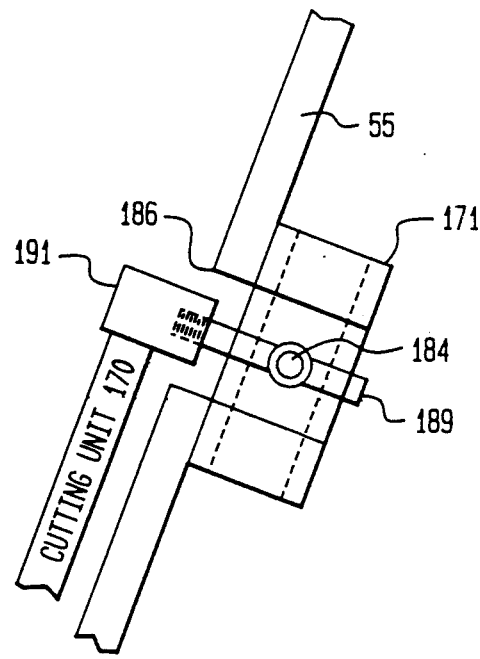

The lower portion of plunger plate 55 supports a stripping and cutting unit 170, through which wire passes as it is fed for insertion into a channel in the waffleline. For this purpose, as shown in the front view of FIG. 6 and in detail in the side view of FIG. 7, located directly beneath gear block 101 are spaced apart bearing mount 171 and cylinder mount 175, affixed to the lower surface 59 of plunger plate 55. Between each of mounts 171 and 175 is a bushing carrier block 176 having a generally elongated oval slot 173 extending from its front face 177 to a centrally located cylindrical bore 178. A drive bushing is inserted into cylindrical bore 178 for rotation as bushing carrier block 176 is translated laterally across the lower face 59 of plunger plate 55, by the operation of a 'cutting' drive cylinder 181, that is affixed to cylinder mount 175. For this purpose, the drive shaft 182 of cylinder 181 is supported in a bushing 183 within cylinder mount 175 and is fixedly coupled to one end of bushing carrier block 176. Similarly, a guide shaft 184 is supported in a bushing 185 in bearing mount 171 and is fixedly coupled to the opposite side of cushing carrier block 176. Cylindrical drive bushing 179 has a rod or shaft 189 which extends othogonally or transverse to the axis of rotation of bushing 179 and passes through a slot 186 in plunger plate 55 to engage a drive arm 191 of a cutting unit 170 on the opposite side of plunger plate 55. As will be described in detail below, when bushing block 176 is translated across the lower surface of plunger plate 55 by the operation of 'cutting' drive cylinder 181, drive bushing 179 rotates within cylindrical bore 178, thereby causing shaft 189 to rotate through slot 186 and, in turn, rotate drive arm 191 of the cutting unit 170.

Figure 8:
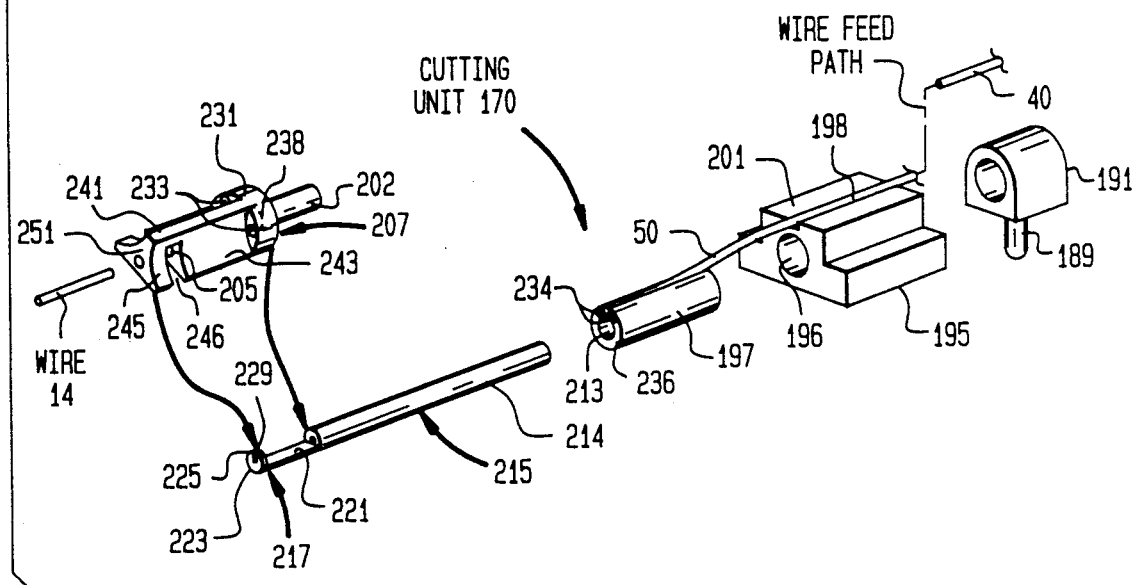
FIG. 8 diagrammatically shows the cutting and stripping components of cutting unit 170.

Cutting unit 170 is diagrammatically illustrated in FIG. 8 as comprising a feed tip mount 195 of generally rectangular block configuration which is bolted to the top surface 60 of the lower end of plunger plate 55. Feed tip mount 195 has a cylindrical bore 196 the axis of which is parallel to the travel axis of the plunger plate and is sized to receive a press-fit cylindrical feed tip 197. Feed tip mount 195 also includes a longitudinal slot 198 in its top surface 201 for retaining a length of lower guide tube 50 through which the wire is fed to a guide bore 205 within a cutting anvil 207. Lower guide tube 50 is also retained within a tapered slot 211 extending longitudinally along the cylindrical surface of feed tip 197. Feed tip 197 further includes a cylindrical bore 213 which is offset from its longitudinal axis and is sized to accommodate for rotation therein the solid cylindrical shaft 214 of a cutter element 215, the lower end 217 of which is hollowed to form a shank portion 221 and a cutting blade 223. Cutting blade 223 has a slot 225 that is sized to permit passage of the wire through it and is sharply tapered to form a shearing edge 229 for cutting the wire. The length of the shank portion 221 of cutter element 215 is sized to accommodate cutting anvil 207, an upper semi-cylindrical land portion 231 of which contains holes 233 through which the cutting anvil is bolted to corresponding tapped holes 234 in the lower face 236 of feed tip 197. The lower portion of the end surface of semi-cylindrical land portion 231 of cutting anvil has a counterbore 238 that is sized to receive an end of lower guide tube 50. From the semi-cylindrical land portion 231 of cutting anvil 207 there extends a ridge portion 241 that tapers to an upper base region 243 and lower base region 245 spaced apart from each other by a gap 246. As clad wire is fed through the counterbore 238 of the cutting anvil, it is exposed by gap 246 to the beam path of a cladding-stripping optical beam, so that the wire may be stripped above the lower (cutting) face 251 of anvil 207. The components of the cutting unit are assembled so that slot 225 in cutting blade 223 is aligned with counterbore 238 in the lower face 251 of anvil 207 as blade 223 is substantially flush against lower face 251. The upper end of the shaft 214 of cutter element 215 is engaged by drive arm 191, so that rotation of the drive arm 191 by the operation of 'cutter' drive cylinder 181 will rotate cylindrical cutter element 215, causing its cutting blade 223 to rotate across lower face 251 of the cutting anvil and thereby sever the wire exiting bore 238.

Figure 9:
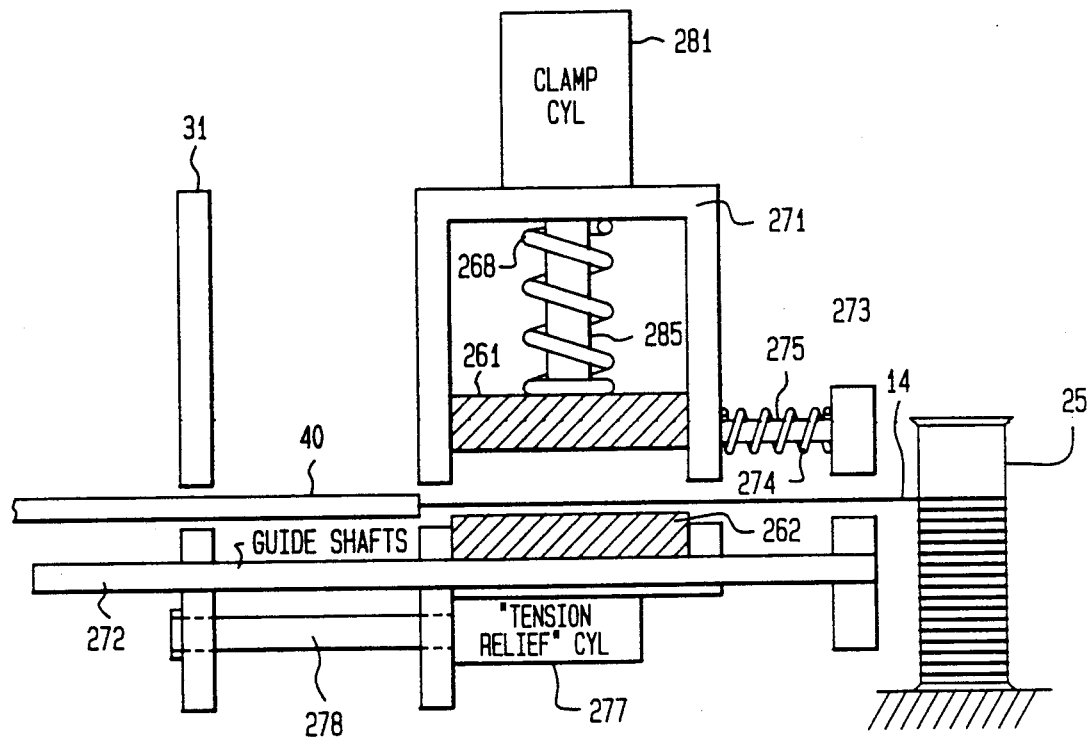
FIG. 9 shows the details of wire tensioning unit 23.

As mentioned above, wire to be installed in the channels of the waffleline plate is supplied as a continuous strand from a spool that is coupled with an upstream wire tensioner unit 23, shown in FIG. 2 as being mounted to an upper end of housing 31. Wire tensioning unit 23 is illustrated in detail in FIG. 9 as comprising a pair of clamping plates 261, 262 between which a continuous stand 14 of clad wire is fed from spool 25 through upper guide tube 40. Upper guide tube 40 is arranged to pass around the upper end of plunger plate 55 and to extend to a location adjacent to feed drive wheel 115 (as shown in FIG. 5, reference above). Each of clamping plates 261, 262 is supported on a mounting bracket 271 that rides on a pair of guide shafts 272 mounted to housing 31. Guide shafts 272 receive a press-fit bracket 273. A pair of extension springs 274 (that are aligned by guide rods 275 passing therethrough) are coupled between brackets 271 and 273, so as to normally urge brackets 271 towards bracket 273 and thereby away from housing 31.

A 'tension relief' cylinder 277 is affixed to mounting bracket 271 and has its output shaft 278 engaged with housing 31 so that operation of drive cylinder 281, against the normal biasing action of springs 274, will displace bracket 271 toward housing 31. As will be described below, when clamping plates 261 and 262 are brought together to clamp wire therebetween, displacing bracket 271 away from housing 31 under the bias of springs 274 serves to impart tension to the wire, the far end of which has been clamped or retained in a waffleline channel. Clamping plates 261 and 262 are normally urged together by the action of a spring 268 which is coupled between plate 261 and bracket 271. A 'clamp relief' cylinder 281 is affixed to bracket 271 and has its output shaft 285 coupled to plate 261, so that by operation of cylinder 281, shaft 285 is retracted, causing plates 261 and 262 to be separated and relieving the clamping force on wire 14.

Figure 10:
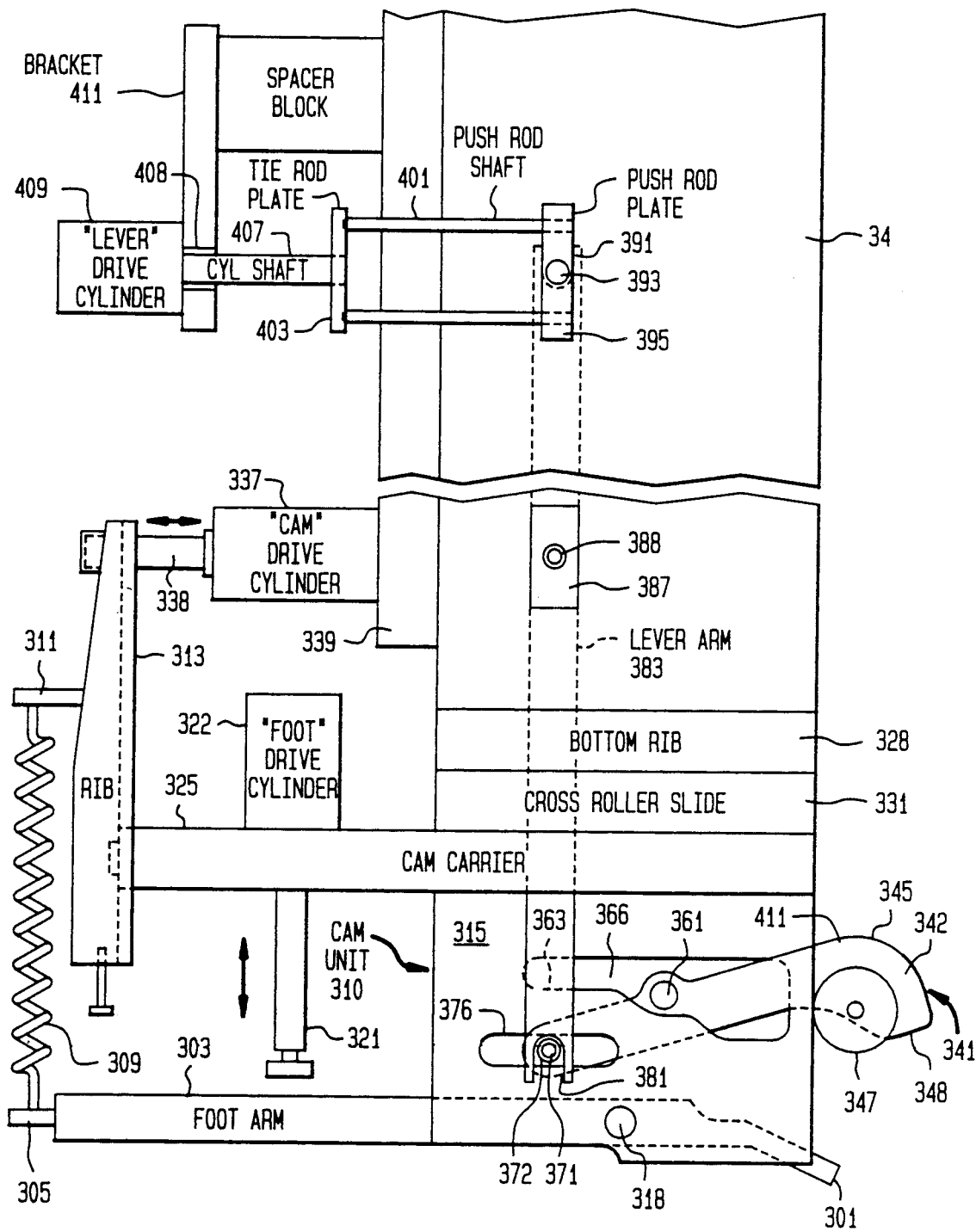
FIG. 10 shows the components of wire installation unit 22.

As pointed out above, through the operation of plunger plate 55, wire feed, stripping and cutting unit 21 is controllably translatable with respect to installation zone 30 whereat wire installation unit 22 is provided. As shown in FIG. 10, wire installation unit 22 includes a foot element 301 that is adjustably attached to a forward end of a horizontally extending longitudinal foot arm 303, the rear end of which retains an attachment extension rod 305, to which one end of an extension spring 309 is coupled. The other end of spring 309 is attached to a spring standoff 311, that is mounted to a horizontally translatable rib 313. Foot arm 303 is pivotally supported between a pair of parallel cam plates 315 (only one of which is shown in FIG. 10) by a pin 318. The top surface of the rear portion of foot arm 303 is engaged by the output shaft 321 of 'foot' drive cylinder 322, that is supported on a cam carrier plate 325 to the rear end 326 of which rib 313 is mounted. Cam carrier plate 325 is mounted to the bottom of a cross roller slide 331, which is affixed to a bottom rib 328 of 'L'-shaped housing 31. Each of cam plates 315 is attached to the cross roller slide-mounted cam carrier plate 325 for horizontal translation thereby. This horizontal translation is effected by means of a 'cam' drive cylinder 337 which is mounted to a backplate 339 of housing 31. The drive shaft 338 of drive cylinder 337 is coupled to horizontally translatable rib 313. Operation of 'cam' drive cylinder 337 horizontally translates shaft 338 and rib 313, thereby horizontally displacing cam carrier plate 325 and the components carried thereby across the bottom of housing 31.

Also supported by cam carrier plates 315 is a wire installation arm 341, a forward end 342 of which has a 'bumper-guide' formed of a pair of curved flanges 345 whereat an installation wheel 347 is rotatably mounted. The lower surfaces 348 of the flanges 345 are substantially flat, and inclined to facilitate direct abutment with the inclined surfaces 351 of a pair of guides 353. As will be described below, guides 353 and flanges 345 are sized and shaped to define the extent to which installation wheel 347 enters into a channel of the waffleline plate 10 over which guides 353 ride during translation of its underlying X-Y table 27. Installation arm 341 is supported by cam plates 315 by means of a central pin 361 that rides upon a tiered or stepped cam surface 363 of a cam slot 366, and by means of a rear pin 371, which is retained in a slot bushing 372, that is translatable within a lower elongated slot 376.

Also coupled with rear pin 371 are the lower fork slots 381 of each of a pair of lever arms 383. Lever arms 383 are mounted to a swivel block 387 and pivotally supported between side plates 34 of housing 31 by means of a pivot pin 388 that passes through the lever arms and the swivel block for pivotal engagement with side plates 34. Each of lever arms 383 has an upper fork slot 391 that is coupled to an upper fork pin 393 which is carried by a push rod plate 395. Push rod plate 395 is mounted by means of a set of push rod shafts 401 to a tie rod plate 403. Tie rod plate, in turn, is affixed to a shaft 407, which passes through a hole 408 in a bracket 411, by way of which the 'lever' drive cylinder 409 of shaft 407 is mounted to the back plate 35 of housing 31. Operation of drive cylinder 409 horizonatally translates each of tie rod plate 403 and push rod plate 395, so that the upper fork slots 391 of lever arms 383 are displaced, thereby causing an opposite pivotal translation of lower fork slots 381, so that rear pin 371 of installation arm 341 is translated within slot 376 of cam plates 315.

Figure 11:
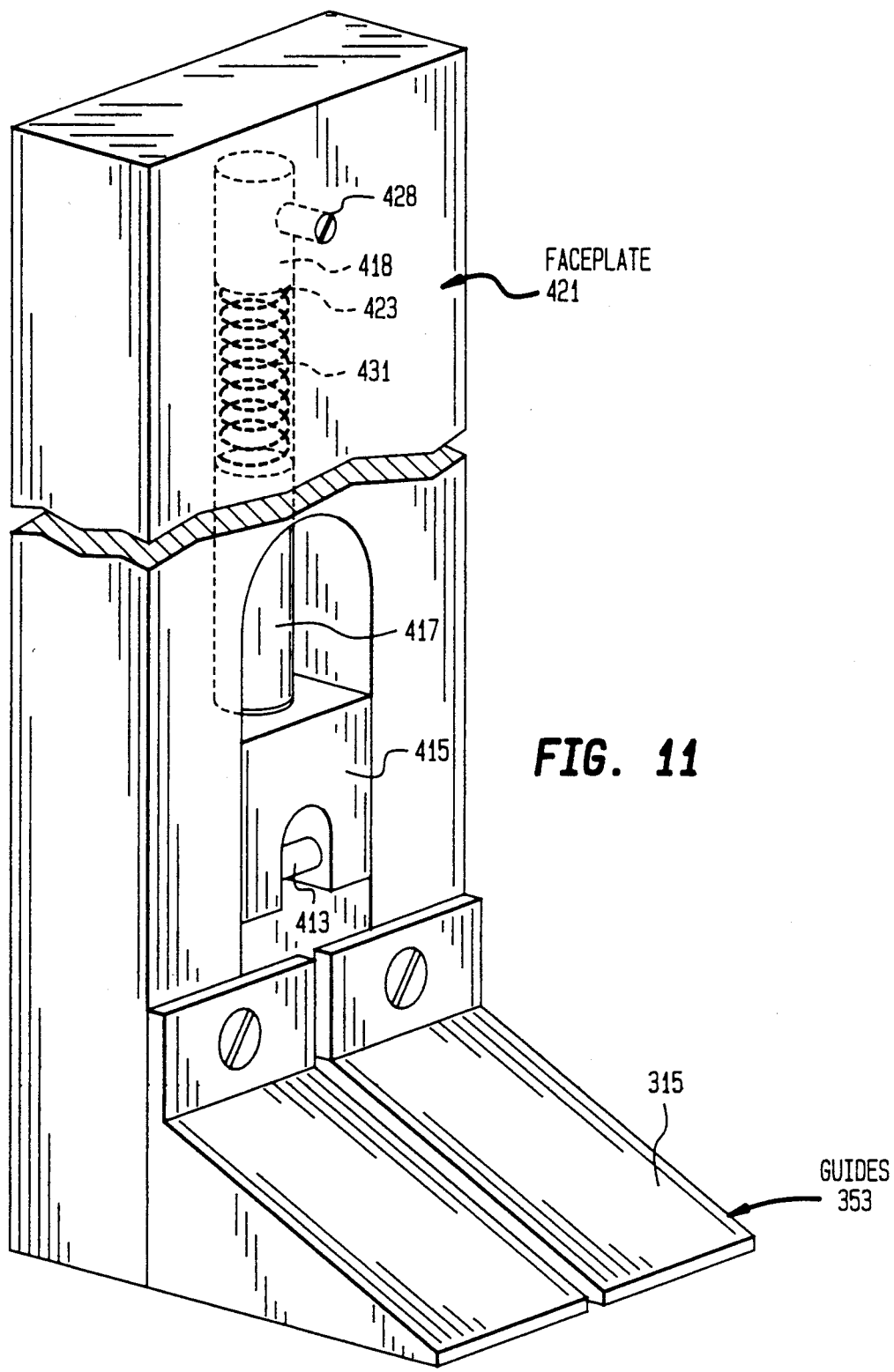
FIG. 11 shows the configuration of a flange arm bias bearing mechanism.

In order for wire installation arm 341, specifically its wheel 347, to maintain downward pressure on wire as it is being installed in a channel, a continual downward spring bias force is applied to the top surface 411 of flanges 345, by means of a bearing 413, shown in FIG. 11. Bearing 413 is retained in a bearing mount 415, which is mounted to a rod 417. Rod 417 is supported within a vertical bore 423 within a faceplate 421. Faceplate 421 is mounted to vertical rib 36 and has guides 353 affixed to the lower front portion thereof. A spring 431 is retained within vertical bore 423 between the top end of rod 417 and the bottom end of an upper rod 418 that is held at a fixed location within bore 423 by means of a locknut 428, or the like. By setting the position of upper rod 418 within bore 423, the downward compressive force imparted by spring 431 through bearing 413 upon installation arm can be adjusted.

Figure 12:
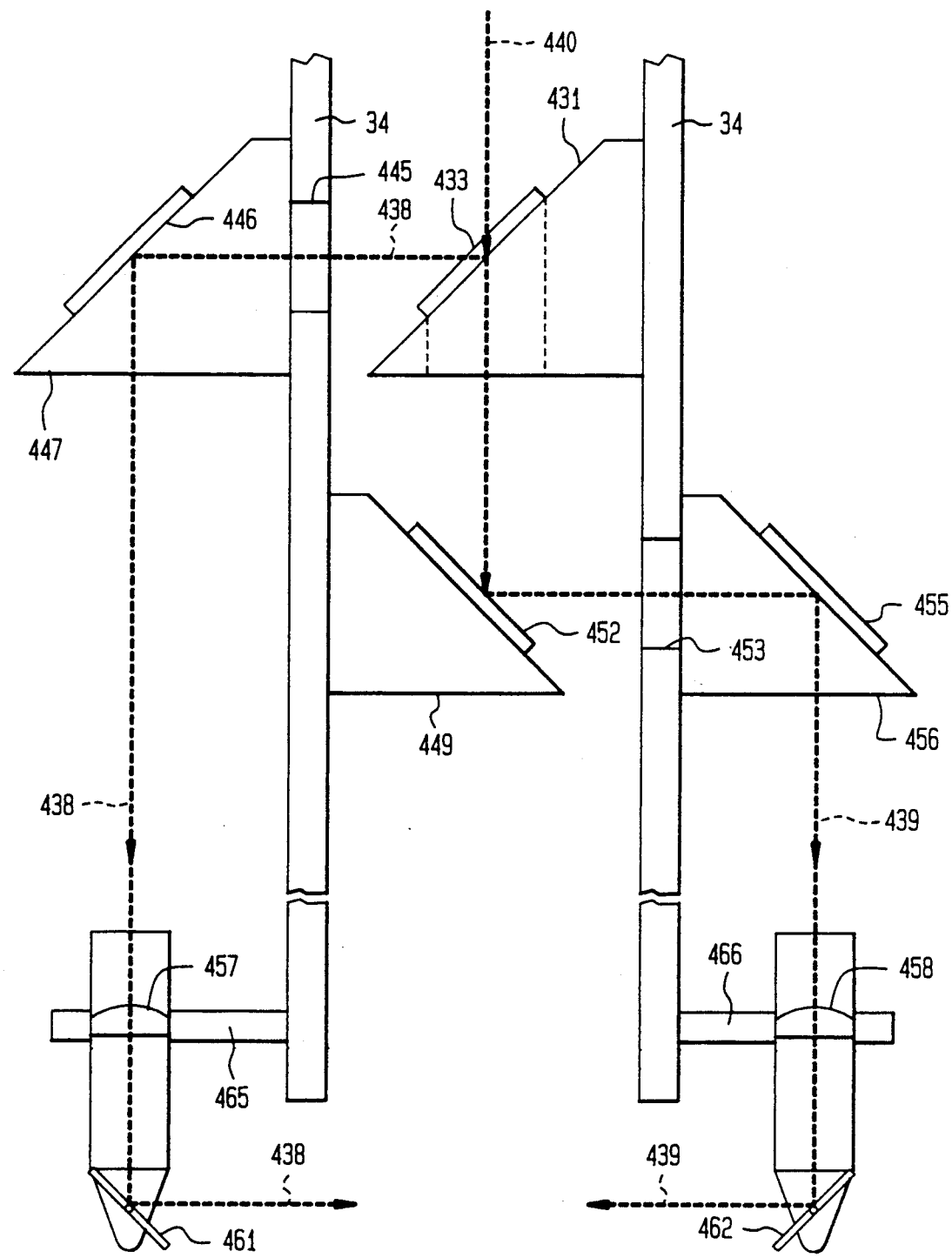
FIG. 12 diagrammatically illustrates a front view of housing 31 and the arrangement of the beam optics.
Figure 13:
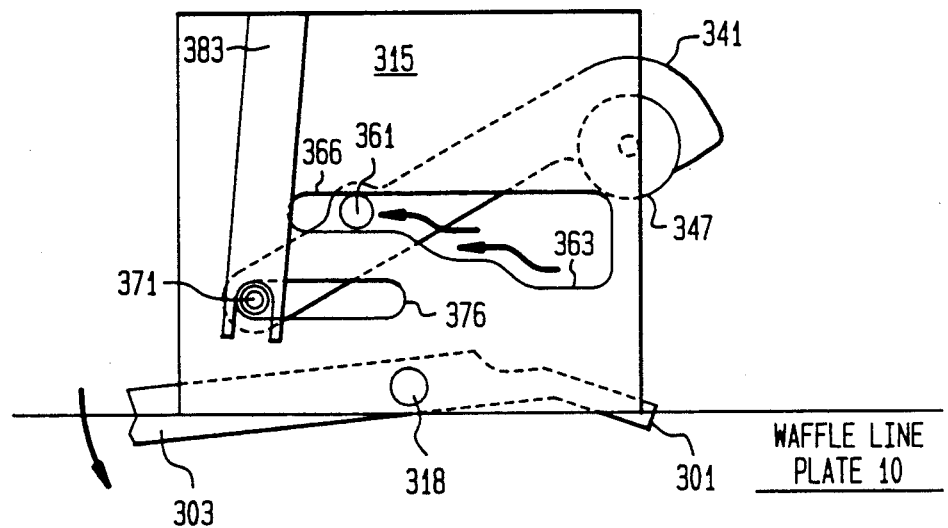
Figure 14:
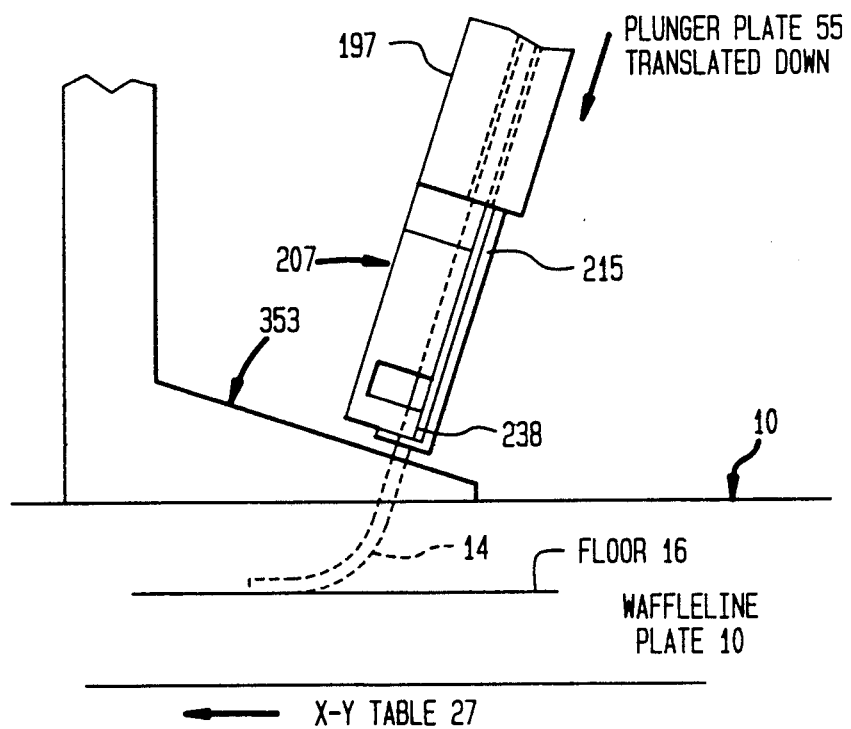
Figure 16C:
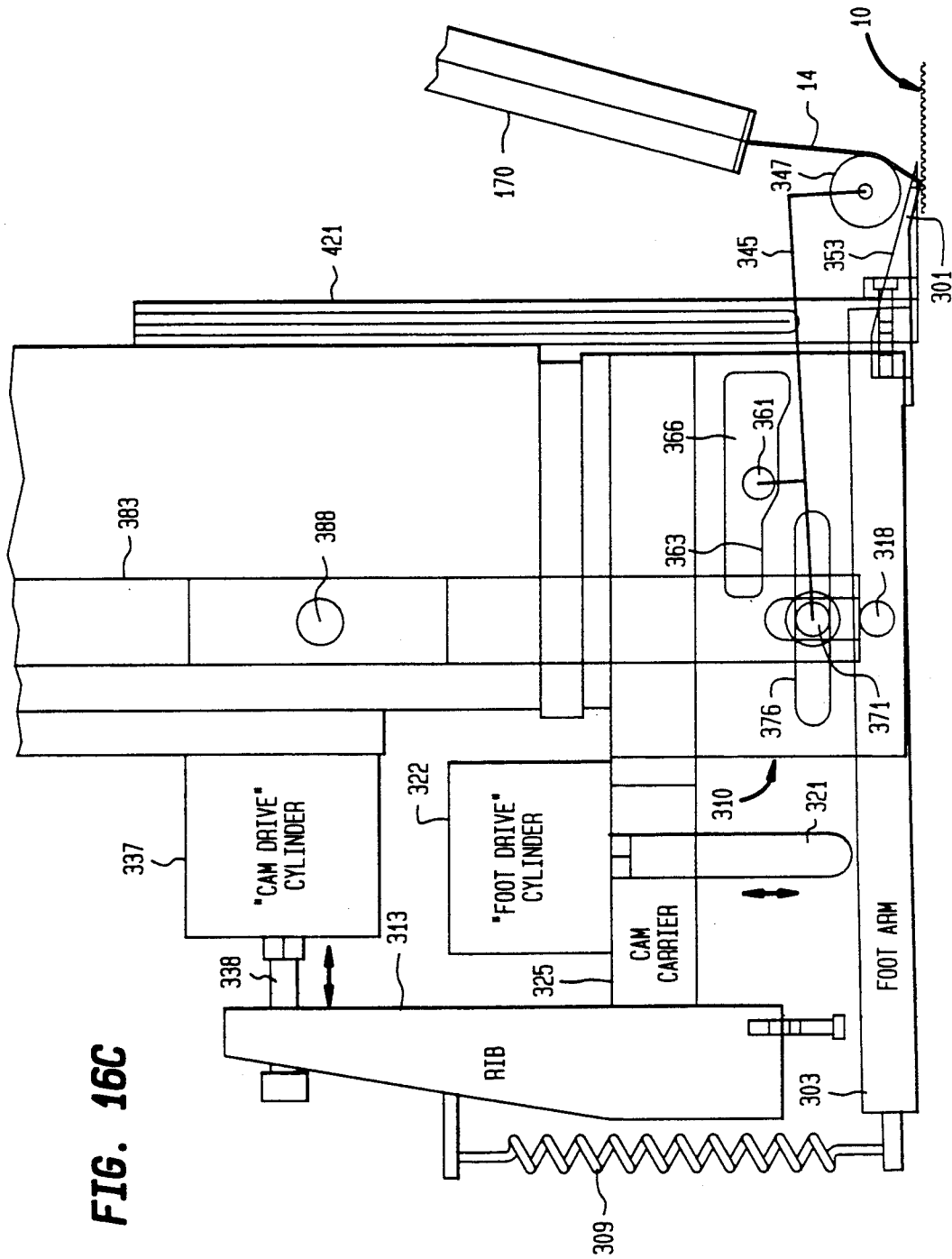
Figure 16E:
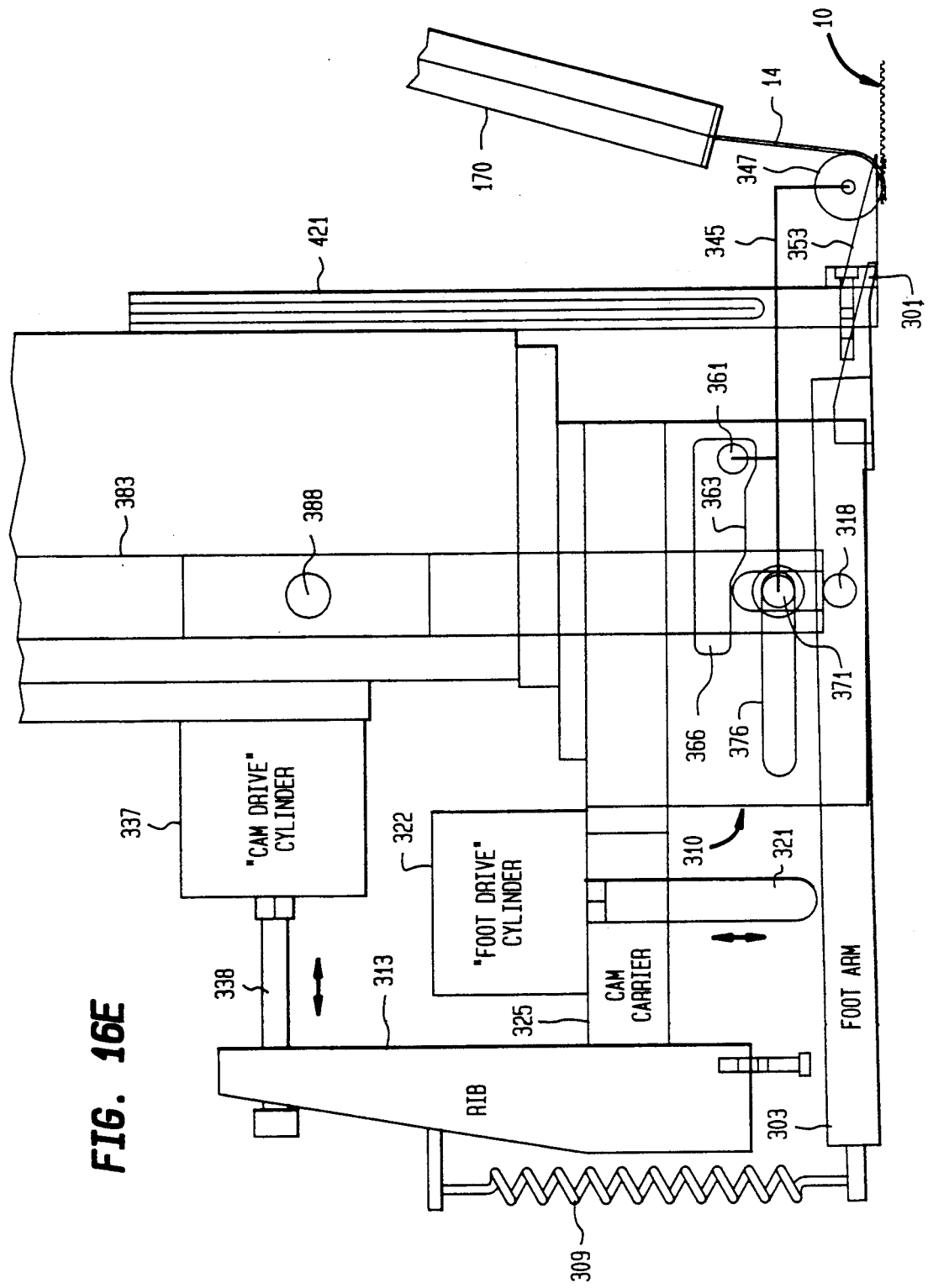
Figure 17:
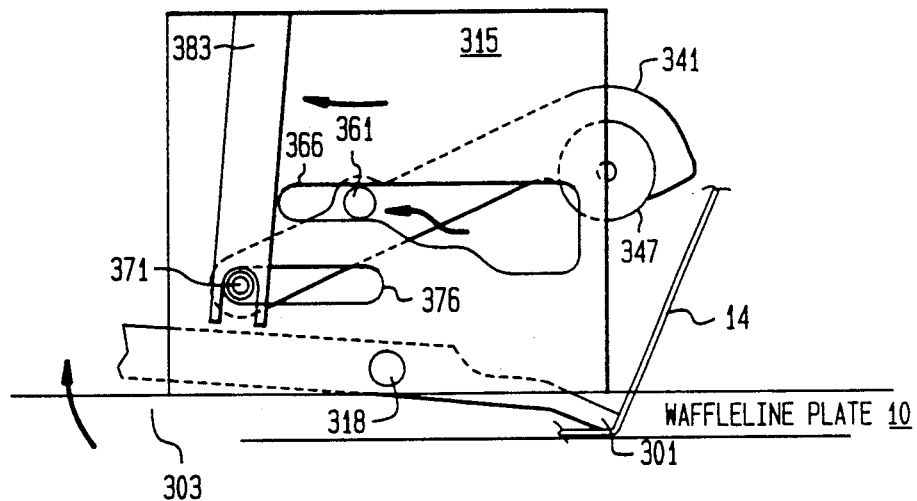
Figure 18:
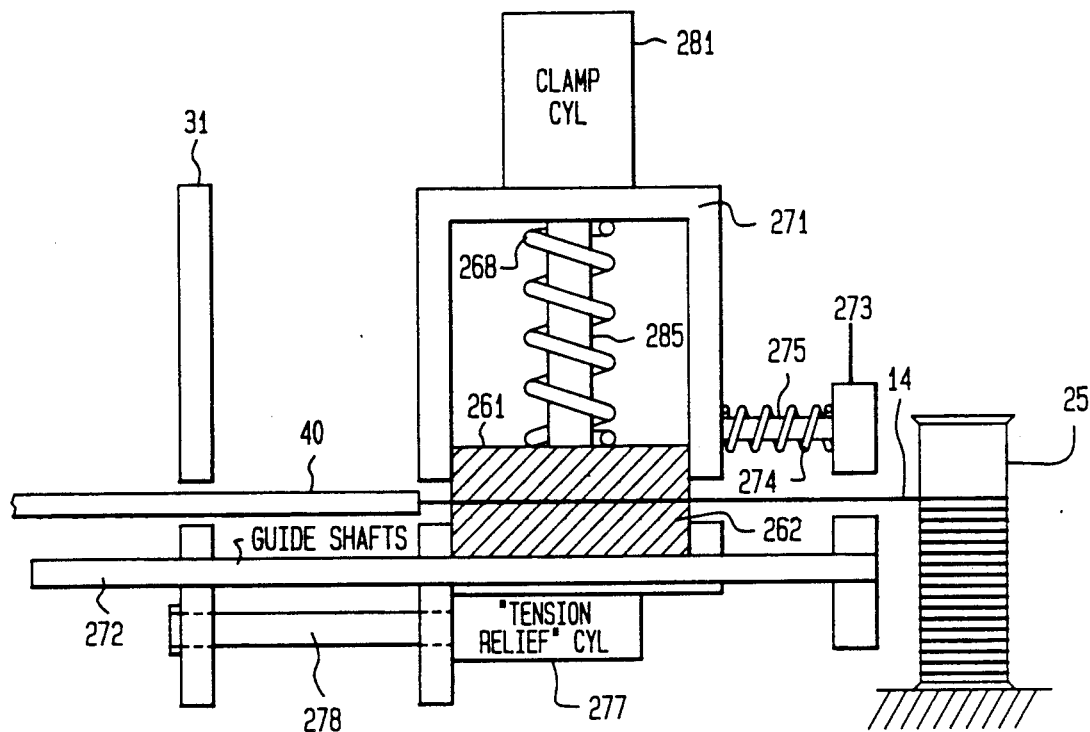
Figure 19:
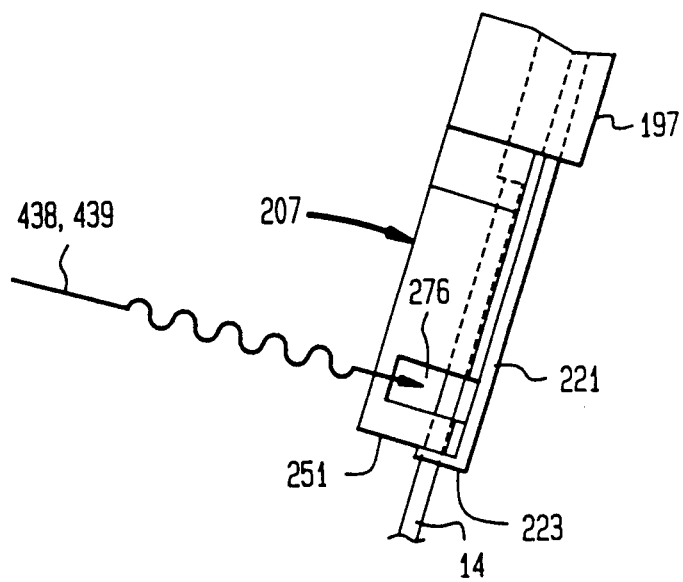
Figure 20:
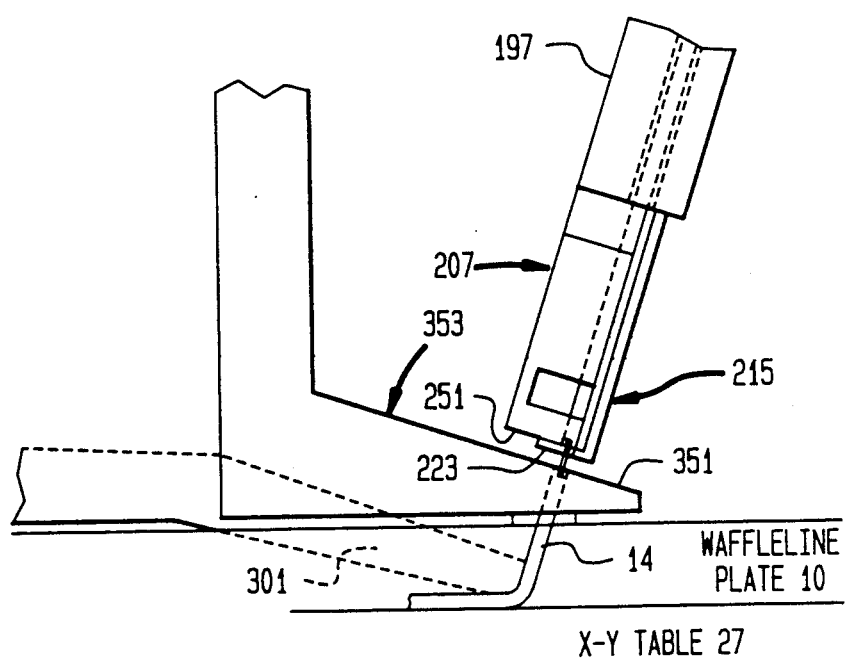

FIG. 12 diagrammatically illustrates a front view of housing 31 and the arrangement of the beam optics which direct a pair of cladding-stripping optical beams into the gap 246 of the cutting anvil (FIG. 8), with plunger plate 55 translated downwardly to its extended position, so as to bring cutting unit 170 into alignment with a pair of optical beam paths. Each of side plates 34 supports a set of optics holders, which contain mirror or beams splitters for directing an incident laser beam that passes through the cylindrical mount of the robotic manipulator, to which top rib 33 of housing 31 is mounted. Specifically, an optic holder 431 is mounted on the interior side of one of the 'L'-shaped side plates 34 and supports a beam splitter 433 in the path of incident beam 440 which has passed along the axis of the cylindrical mount of robotic manipulator 26 atop rib 33 of housing 31. The split beam then travels along a first path 438 through an aperture 445 in one of the side plates 34 and is reflected off a mirror 446 that is supported by an optic holder 447 affixed to the outer face of that side plate. Directly beneath beam splitter 433 is a mirror 452 supported by an optic holder 449, mounted to the interior face of a side plate. Through an aperture 453 in the opposite side plate the second beam path 439 from mirror 452 is reflected off a mirror 455 supported by an optic holder 456 on the outer face of the side plate. Beam paths 438 and 439 travel vertically downward, parallel to the sides of sideplates 34, through lenses 457, 458 and reflect off mirrors 461 and 462, which are supported by lens-mirror support brackets 465, 466 at the level of the extended position of cutting unit 170.

OPERATION

As pointed out above, operation of the robotic wire installation apparatus of the present invention is directed by a control processor 24 in accordance with a prescribed wiring sequence program (a source code listing of which has been supplied as an appendix, as noted above). Rather than set forth the details of that program, per se, the discussion to follow will describe the operations of each of the controlled components of the system in the course of a typical feed, installation, strip and cut sequence. For this purpose attention is directed to FIGS. 13-20, which show partial and enlarged partial views of various portions of the wire installation apparatus described above, during respective stages of translation of respective components of the system and manipulation of the wire in the course of its installation in a waffleline channel. In addition,

INITIALIZATION (FIG. 13)

At an arbitrarily assumed starting point, plunger 55 is in its retracted position, whereat the wire has been cut. In addition, each of wire installation arm 341 and foot arm 301 is in its retracted position. When fully retracted, wire installation arm 341 is displaced to its rearwardmost position within cam unit 310, so that pin 371 is to the rear of slot 376 and pin 361 is at the highest and rearwardmost tier or step of cam slot 366, as cam carrier 325 is translated rearwardly by 'cam'cylinder 337. In addition, 'foot' cylinder 322 is operated to translate output shaft 321 vertically downward, thereby pivoting foot arm 303 counter-clockwise (CCW) about pin 318. Consequently, both wire manipulation units 21 and 22 are 'out-of-the-way' of the waffleline plate 10. Also, the wire is unclamped by the tensioning unit 30.

WIRE FEED/INSERTION (FIG. 14)

After the X-Y table 27 has translated the waffleline plate 10 to a starting or wire insertion location, and with the wire 14 frictionally engaged by the drive and idler wheels of the wire feed unit, 'plunger' drive cylinders 65 are operated, so as to lower plunger plate 55 from its retracted position to its extended position, at which cutting unit 170 nearly abuts against the inclined surfaces 351 of guides 353 (which are positioned at the wire insertion point in a channel 12 of waffleline plate 10). 'Impulse feed' drive cylinder 72 is stepped, as the X-Y table is translated toward guides 353, thereby causing the wire feed wheels to incrementally advance the wire downwardly through bore 238 in cutting anvil 207, through the opening between guides 353. Because of the movement of the X-Y table 2 and the inclination of plunger plate 55, the free end of the wire is effectively dragged and bent toward the direction of translation as it encounters the waffleline plate. This bend, dragging effect facilitates correct directional insertion and clamping of the wire in the channel.

FOOT CLAMPS WIRE IN CHANNEL (FIGS. 15A, 15B)

With the end of the wire inserted into the channel, 'foot' drive cylinder 322 retracts its output shaft 321, so that foot arm 303 rotates clockwise (CW) about pin 318. As a consequence, foot 301 is brought forward and downward upon wire 14, pushing the wire down and clamping the wire at the floor or bottom 16 of the channel, with tension provided by spring 309.

WIRE FEED RELEASE

With the end of the wire clamped at the bottom the the channel, 'idler' drive cylinder 181 is operated to withdraw idler wheel 125 away from drive wheel 119, thereby releasing the wire and allowing it to be freely drawn from spool 25.

PLUNGER PLATE RETRACTS (FIGS. 15C, 15D)

Following release of the idler wheel, 'plunger' drive cylinders 65 are operated to retract plunger plate 55 to its previous retracted position, thereby allowing room for flange arm 341 to be translated forward so that wheel 347 may engage the clamped wire.

INSTALLATION WHEEL FORWARD (FIGS. 16A, 16B)

With the plunger plate 55 retracted, allowing flange arm 341 room to move forward over guides 353, 'lever' drive cylinder 409 is operated, retracting shaft 407, and thereby translating pin 371 forward in slot 376. As pin 371 is moved forward until pin 361 is over the center tier or step of cam surface surface 363, flange arm 341 is also moved outwardly over guides 353, thereby preforming the wire in the forward direction, while still being firmly clamped in the channel by foot 301.

FOOT RETRACTS (FIGS. 16C, 16D)

Next, 'foot' drive cylinder 322 is operated to push shaft 321 downwardly, thereby lifting foot 301 away from the wire at the bottom of the channel.

INSTALLATION WHEEL DOWN ONTO WIRE IN CHANNEL (FIGS. 16E, 16F)

Finally, 'cam drive' cylinder 337 is operated to drive the cam carrier outwardly. so that pin 361 drops to the lowest step of tiered cam surface 363, allowing installation wheel 347 to move downward between guides 353 and effectively roll on wire 14 in the channel, as the bottom surface 348 of flange arm 341 nearly comes to rest on the top inclined surfaces 351 of guides 353. Spring 431 causes pressure to be applied to wheel 347, so that the wire is 'seated' in the channel. Because the 'fender' portion of flange arm 341 is curved, the wire is bent around the wheel and the flange arm. During its translation, flange arm 341 is continuously biased downwardly by bearing 413, so that it is urged firmly toward guides 353.

X-Y TABLE TRANSLATED TO INSTALL WIRE

With wheel 347 now resting atop wire 14 in channel 12 (under a continuous downward bias by bearing 413 in faceplate 421), X-Y table 27 is translated (from right to left as viewed in FIG. 18) some predefined distance necessary to complete a prescribed linear run length. During this translation, installation wheel 347 rotates as the channel passes beneath the wheel, drawing wire is spool 25 and installing it in the channel. If the wire is to be cut at the end of the run, the operation proceeds to a strip and cut step (to be described below). If the run is only a portion of a meandering path over which the wire is being installed and a turn (e.g. 90°) is now required, the instasllation procedure proceeds to a turn step. For purposes of the present description, it will be assumed that such a turn is required next.

WIRE CLAMPED AND TENSIONED FOR TURN (FIGS. 17, 18)

Given the dimensions of the microwave waffleline structure of the present example, (25 mil channel widths) it goes without saying that laying out the wire over a meandering path requires very sharp turns and an extremely tight fit at the mesa corners. In accordance with the present invention, this problem is addressed by pre-shaping or imparting a slight kink in the wire whenever a turn is encountered during the installation process. For this purpose, at the point in the installation process where a turn is to be executed, the wire is clamped in the channel by foot 301. Then, a slight tension is imparted to the adjacent free segment of the wire being supplied. When this tension is released a slight twist or kink will have been imparted to the region of the clamped portion of the wire, so that the wire readily lends itself to a change in direction.

In order to tension the wire, the wire must be clamped in the channel. Since the flange arm wheel 347 is presently resting atop the wire, it is necessary to withdraw the flange arm 341 and bring the foot forward. Namely, the positions of the wheel 347 and foot 301 must be reversed. For this purpose 'cam drive' cylinder 337 is operated to move cam unit 310 forwared and place pin 361 at the middle tier position of cam surface 363. Then lever drive cylinder 409 is operated to rotate lever 383 clockwise and withdraw pin 371 rearwardly in slot 376, thereby lifting flange arm 341 upwardly and rearwardly along cam surface 363 until pin 361 is at the top tier or step. After wheel 347 has been retracted, 'foot' drive cylinder 322 retracts its output shaft 321, so that foot arm 303 rotates clockwise (CW) about pin 318. As a consequence, foot 301 is brought forward and downward upon wire 14, clamping the wire at the bottom of the channel. With the end of the wire clamped at the bottom the channel, 'clamp' drive cylinder 281 is operated, so as to release clamp 261 against the action of spring 268, thus clamping wire 14 between clamps 261 and 262. With the wire now clamped at two places, 'tension' drive cylinder 277 is released, allowing bracket 271 to be pulled toward bracket 273 by the action of springs 274, thereby tensioning the clamped wire.

ROBOTIC MANIPULATOR ROTATED

Once the wire has been tensioned, 'clamp' drive cylinder 281 is operated to withdraw shaft 285 and release clamp 261, thereby terminating the tension on the wire. Also, foot drive cylinder 322 is operated to rotate foot arm 303 and lift foot 301 away from clamping engagement with the wire. As a consequence, flange arm 341 and foot 301 of wire installation unit 22 are now out of the way, so that robotic manipulator 26 may be rotated in preparation for a new run. If the direction of the new run is at 90° from the previous run, a simple 90° rotation is all that is required. In some circumstances it may be necessary to effect a 270° turn, in order to avoid 'wrapping-up' control cabling. After the manipulator is rotated, X-Y table 27 is translated by one grid period (the fifty mil spacing between channels). Clamping foot 301 is then lowered and released, so as to initially seat the wire in the new direction in the channel.

WIRE INSTALLATION ALONG NEW DIRECTION

Pretensioning of the wire has imparted sufficient twist or preshape to the wire to facilitate its installation along the new path. After the turn of the robotic manipulator 26 (and thereby units 21 and 22) and any translation of X-Y table 27 have been completed, foot 301 is moved forward from its retracted position, as described above with reference to FIG. 15, and the wire is once again clamped, but in a new channel. Then foot 301 is retracted, lever arm 383 moved forward and cam unit 310 translated back, thereby causing installation wheel 347 to again engage the seated wire. X-Y table 27 may then be translated, to install another run of wire.

The above sequence is repeated as necessary, until the wire has been installed over its intended path (straight or piecewise linear) and is now ready to be stripped and cut.

STRIPPING OF CLADDING (FIG. 19)

Once X-Y table 27 has been translated to a location where the wire is to be stripped and cut (which, as determined by layout control software, is slightly upstream of the actual location where the stripped and cut wire is to be connected to a circuit device), movement of the table is stopped. Then, the tensioning sequence described above with reference to FIGS. 17 and 18 is carried out. Namely, flange arm 341 is retracted, foot 301 is brought forward to clamp the wire in the channel, clamps 261 and 262 are engaged to clamp the wire and 'tension' drive cylinder is operated to place the clamped wire in tension between the channel and the supply spool 25.

With the wire now clamped in tension, 'plunger' drive cylinders 65 are operated to translate plunger plate 55 down the wire to a prescribed position whereat gaps 246 in the cutting anvil 207 of cutting unit 170 are optically aligned with the pair of beam paths 438 and 439 from an associated laser (e.g. an industrial $CO_2$ laser not shown). The laser is then pulsed to vaporize the cladding from that portion of the wire exposed through anvil gaps 246. (Residue is removed by an associated micro-vacuum head, not shown, and vented from the system.) With the wire now stripped, tension on the wire is released and plunger plate 55 is retracted. In addition, the positions of foot 301 and flange arm 341 are again interchanged, as foot 301 is retracted and installation wheel 347 is lowered onto the wire in the channel. X-Y table 27 is now translated, sc that rotation of wheel 347 draws the freed wire toward the channel until the midpoint of the stripped portion, whereat the wire is to be cut, is coincident with the lower face 251 of anvil 207.

CUTTING OF WIRE (FIG. 20)

With the stripped portion of the wire drawn down to approximately the level of guide fingers, where the wire is to be cut, the translation of the X-Y table is halted and the positions of the installation wheel 347 and clamp foot 301 are once again interchanged. Namely, flange arm 341 is retracted and clamp foot 301 is brought forward to clamp the wire in the channel. 'Clamp' and 'tension' drive cylinders 281 and 277, respectively, are once again operated to place the wire in tension. In addition, 'plunger' drive cylinder is operated to lower plunger plate 55 down the tensioned wire until the bottom surface of cutting blade 223 of cutter 215 is nearly flush with the top surfaces 351 of guide fingers 353. Before cutting the wire, 'idler' cylinder 143 is operated to release idler wheel to engage the tensioned wire, thereby minimizing 'bounce' when the wire is cut. 'Cutter' cylinder 181 is then operated to rotate drive arm 191 and thereby blade 223 across the cutting surface 251 of cutting anvil 207, severing the stripped wire at that point. With the wire now cut, foot 301 is retracted to its original withdrawn condition shown in FIG. 13. Also, with the tension released by the severing of the wire, 'clamp' and 'tension' drive cylinders 281 and 277, respectively, are returned to their normal states, so that the wire is free to be fed for a new installation.

As will be appreciated from the foregoing description, automatic installation, stripping and cutting of clad wire over any X-Y channel of a MMIC-supporting waffleline structure are successfully accomplished by an automated, robotically controlled wire installation scheme that is useful for real time manufacturing and assembly. Despite the extremely narrow tolerances and tight corners of a high frequency application waffleline plate, point-to-point transmission line connectivity over any X-Y channel path is readily achieved.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed is:

1. A system for installing a segment of strand material in a support structure therefor, said support structure including a strand-receiving trough having side walls and a bottom floor recessed beneath a top surface of said support structure, comprising in combination:

first means for controllably supplying strand material to said trough of said support structure;

second means, positioned at a first location of said trough, for controllably inserting and retaining a first portion of said strand material into a first, strand receiving region of said trough such that said first portion of said strand material is urged into said trough adjacent to the bottom floor thereof;

third means for causing further strand material to be drawn from said first means and installed along said bottom floor of said trough;

fourth means for severing, at a second location of said trough, strand material being supplied by said first means from said further strand material installed by said third means, so that a segment of strand material is installed between said first and second locations of said trough.

2. A system according to claim 1, wherein said strand material has a coating material thereon and further including fifth means, coupled with said fourth means, for removing coating material from said strand material prior to said fourth means severing strand material.

3. A system according to claim 2, wherein said second, strand receiving region of said trough comprises a non-linear trough path from said first, strand receiving region of said trough and wherein said first means includes means for preshaping strand material to be installed along the bottom floor of said trough to assist the installation of strand material along said non-linear trough path by said third means.

4. A system according to claim 1, wherein said fourth means includes means, coupled with said first means, for placing strand material, being supplied by said first means to said second location, in tension, prior to severing strand material being supplied by said first means from said further strand material installed by said third means.

5. A system according to claim 1, wherein said fourth means comprises a cutting device through which said strand material is controllably supplied by said first means and including means for causing said strand material to be directed toward said first, strand receiving portion of said trough whereat said second means controllably inserts and retains said first portion of said strand material.

6. A system according to claim 5, wherein said fifth means includes means for directing electromagnetic energy onto a portion of strand material adjacent to said cutting device, so that coating material is removed thereat.

7. A system according to claim 6, wherein said cutting device comprises a tubular element containing a cutting anvil having an aperture through which strand material passes, and an associated shear element arranged to be displaced across said cutting anvil so as to sever strand material that extends through said aperture.

8. A system according to claim 7, wherein cutting anvil includes an opening through which an optical beam may pass and be incident on strand material passing therethough and wherein said fifth means includes means for directing an optical beam through said opening and onto strand material passing though said cutting anvil, so as to remove coating material.

9. A system according to claim 5, wherein said fourth means includes means for bringing said cutting means into proximity of second location of said trough and wherein said system further includes sixth means for aligning the location of said cutting means relative to said second location.

10. A system according to claim 9, wherein said sixth means includes a guide element into which said cutting means is brought into contact during the operation of said proximity bringing means, so as to locate said cutting means relative to said second location of said trough.

11. A system according to claim 1, wherein said third means includes a wheel supported for rolling engagement with strand material, and wherein said system includes fifth means for positioning said wheel relative to said trough, so that, as further strand material is drawn from said first means, said wheel is positioned to install said further strand material into said trough along the bottom floor thereof.

12. A system according to claim 11, wherein said second means comprises a foot element for urging a first portion of said strand material into a first, strand receiving region of said trough, and wherein said fifth means includes means for alternately bringing one of said wheel and said foot element into engagement with strand material that has been fed to said trough, while retracting the other of said wheel and said foot from strand material that has been fed to said trough.

13. A system according to claim 12, wherein said fifth means includes a translatable cam device supporting said wheel and said foot element for movement relative to said trough.

14. A system according to claim 1, wherein said first means comprises means for incrementally feeding said strand material to said trough.

15. A system for installing a segment of strand material in a support structure therefor, said support structure including a strand-receiving trough having side walls and a bottom floor recessed beneath a top surface of said support structure, comprising, in combination:
 a first unit supported for translatable movement toward and away from said trough in said support structure, said first unit including means for controllably supplying strand material to said trough in said support structure and means for severing strand material being supplied by said first means, so that a segment of strand material may be supplied to and installed along the bottom floor of said trough between first and second locations thereof, and
 a second unit arranged adjacent to said support structure, said second unit including means for controllably inserting and retaining a first portion of strand material controllably supplied from said first unit into a first, strand receiving region of said trough, and means for causing further strand material to be drawn from said first unit and installed along said bottom floor of said trough.

16. A system for installing a segment of insulation-clad wire in a wire-supporting grid structure having a two-dimensional array of wire-receiving grid channels, each grid channel having side walls and a bottom floor recessed beneath a top surface of said grid structure, comprising, in combination:
 an X-Y table upon which said wire-supporting grid structure is placed for two-dimensional translation thereby;
 a first, wire-feed, insulation-stripping and wire-severing mechanism arranged adjacent to said X-Y table and displaceable toward and away from said X-Y table and a wire-supporting grid structure provided thereon, said first mechanism including an insulation-stripping and wire-cutting device positionable adjacent to a wire-supporting grid structure mounted on said X-Y table and including means for feeding insulation-clad wire to said device by way of which wire is directed into a wire-receiving channel of said wire-supporting grid structure; and
 a second, wire-installing mechanism arranged adjacent to said X-Y table, so that a wire-supporting grid structure mounted thereon may be two-dimensionally displaced relative to said second mechanism, said second mechanism including means for causing a first portion of a wire directed by way of said device into a first wire-receiving region of said channel to be retained therein and for causing a second portion of said wire to be drawn from said first mechanism and installed along the bottom floor of said channel as said X-Y table is translated.

17. A system according to claim 16, wherein said insulation-stripping and wire-cutting device includes a cutting anvil having an aperture through which wire passes and a shear element arranged to be displaced across the aperture in said cutting anvil, so as to sever wire extending therethrough.

18. A system according to claim 17, wherein cutting anvil includes an opening through which an optical beam may pass and be incident on insulation-clad wire passing therethough and wherein said system includes means for directing an optical beam through said opening and onto insulation-clad wire passing though said cutting anvil, so as to remove insulation therefrom.

19. A system according to claim 16, wherein said means for feeding insulation-clad wire to said insulation stripping and wire-cutting device comprises an incrementally driven wheel and an idler wheel arranged to engage said wire and feed said wire to said insulation stripping and wire-cutting device.

20. A system according to claim 19, wherein said incrementally feeding means comprises means for urging said idler wheel toward said driven wheel so as to enable a wire that is to be incrementally fed to be engaged between said wheels.

21. A system according to claim 20, wherein said incrementally feeding means includes means for controllably urging said idler wheel away from said driven wheel so as to enable said wire to be freely translatable relative to said wheels.

22. A system according to claim 16, wherein said first mechanism includes means for engaging a wire, a portion of which has been retained in a channel of said wire-supporting grid structure and for placing the engaged wire in tension and thereafter releasing the tension on said wire so as to preshape said wire to facilitate its installation along the bottom floor of a non-linear path traversing intersecting channels of said wire-supporting grid structure.

23. A system according to claim 17, wherein said first mechanism includes means for placing a clad wire in tension, prior to severing said wire.

24. A system according to claim 16, wherein said second mechanism includes a wheel supported for rolling engagement with wire and wherein means for positioning said wheel relative to said wire-supporting grid structure, so that as wire is drawn from said first mechanism, the wheel is positioned to install wire along the bottom floor of said wire-receiving channel of said wire-supporting grid structure.

25. A system according to claim 24, wherein said second mechanism comprises a foot element for urging said first portion of wire into a first, wire-receiving region of said channel, and means for alternately bringing one of said wheel and said foot element into engagement with wire that has been fed to said channel, while retracting the other of said wheel and said foot therefrom.

26. A system according to claim 25, wherein said second mechanism includes a translatable cam device supporting said wheel and said foot for movement relative to said channel.

27. A method of installing a segment of insulation-clad wire in a wire-supporting grid structure having a two-dimensional array of wire-receiving regions comprising the steps of:
  (a) mounting said wire-supporting grid structure on an X-Y table for for two-dimensional translation thereby;
  (b) arranging a first, wire-feed, insulation-stripping and wire-severing mechanism adjacent to said X-Y table so as to be displaceable toward and away from a wire-supporting grid structure mounted on said X-Y table, said first mechanism including an insulation-stripping and wire-cutting device positionable adjacent to said wire-supporting grid structure;
  (c) positioning a second, wire-installing mechanism adjacent to said X-Y table, so that a wire-supporting grid structure mounted on said X-Y table may be two-dimensionally displaced relative to said second mechanism, said second mechanism including a foot element through which a first- portion of a wire may be urged into a wire-receiving region of said wire-supporting grid structure and a wheel through which a second portion of wire drawn from said first mechanism may be urged into a second wire-receiving region of said grid structure as said X-Y table is translated;
  (d) displacing said first mechanism toward said wire-supporting grid structure so that said insulation-stripping and wire-cutting device is positioned adjacent to a first wire-receiving region of said wire-supporting grid structure;
  (e) feeding insulation-clad wire to said insulation-stripping and wire-cutting device and thereby directing wire into said first wire-receiving region of said wire-supporting grid structure;
  (f) bringing said foot element into engagement with a first portion of said wire, so as to urge said first portion of said wire into said first wire-receiving region of said wire-supporting grid structure; and
  (g) bringing said wheel into engagement with a second portion of said wire and translating said X-Y table so a to cause rotation of said wheel over said second portion of said wire, drawing wire from said first mechanism and urging the drawn wire into said second wire-receiving region of said grid structure as said X-Y table is translated.

28. A method according to claim 27, further including the step of:
  (h) operating said insulation-stripping and wire-cutting device so as to remove insulation from said wire and sever wire from that which has been urged into said second wire-receiving region of said grid structure.

29. A method according to claim 27, wherein step (h) comprises bringing said insulation-stripping and wire-cutting device to a location adjacent to said X-Y table and, thereat, causing said insulation-stripping and wire-cutting device to remove insulation from said wire and to sever wire.

30. A method according to claim 29, wherein step (h) includes moving said wheel away from and bringing said foot element into engagement with a portion of said wire that has been installed in said second wire-receiving region of said grid structure region, so as to clamp said wire thereat, and placing that portion of said wire outside of said grid structure that has been clamped by said foot element in tension prior to causing said insulation-stripping and wire-cutting device to remove insulation from said wire and sever said wire.

31. A method according to claim 30, wherein said insulation-stripping and wire-cutting device includes a cutting anvil having an opening through which an optical beam may pass and be incident on insulation-clad wire passing therethough and wherein step (h) includes directing an optical beam through said opening and onto insulation-clad wire passing through said cutting anvil, so as to remove insulation therefrom.

32. A method according to claim 27, further including the step of (i) operating said foot element so as to clamp a portion of said wire in a wire-receiving portion of said wire-supporting grid structure, operating said first mechanism to place said clamped portion of wire in tension, and thereafter releasing the tension on said wire so as to preshape said wire to facilitate its installation in a non-linear wire-receiving region of said wire-supporting grid structure.

33. A method according to claim 27, wherein step (f) and (g) are carried out such that as said wheel is brought into engagement with said second portion of said wire, said foot element is retracted from said first portion of said wire.

34. A system for installing a segment of insulation-clad wire in a wire-supporting grid structure having a two-dimensional array of wire receiving channels, each channel having side walls and a bottom floor recessed beneath a top surface of said grid structure, comprising:
  an X-Y table upon which said wire supporting grid structure is placed for two-dimensional translation thereby;
  a first, wire feed, stripping and severing mechanism arranged adjacent to said X-Y table and being displaceable toward and away from X-Y table and a wire-supporting grid structure supported thereby, said first mechanism including an insulation stripping and wire cutting device positioned adjacent to a wire-supporting grid structure mounted on said X-Y table and including means for feeding insulation-clad wire to said device by way of which a wire is directed into a wire receiving channel of wire-supporting grid structure; and
  a second, wire installing mechanism arranged adjacent to said X-Y table so that a wire-supporting grid structure supported thereby may be two-dimensionally displaced relative to said second mechanism, said second mechanism including means for causing a first portion of wire directed by way of said device into a first wire-receiving region of said channel to be retained therein and for causing a second portion of said wire to be drawn from said first mechanism and installed along the bottom floor of said channel as said X-Y table is translated.

35. A system according to claim 34, wherein said wire stripping and cutting device comprises cutting anvil having an aperture through which wire passes and a shear element arranged to be displaced across the aperture in said cutting anvil, so as to sever wire extending therethrough.

36. A system according to claim 35, wherein cutting anvil includes an opening through which an optical beam may pass and be incident on insulation-clad wire passing therethrough and wherein said fifth means includes means for directing an optical beam through said opening and onto insulation-clad wire passing though said cutting anvil, so as to remove coating material.

37. A system according to claim 34, wherein said means for feeding insulation-clad wire to said insulation stripping and cutting device comprises a first incrementally driven wheel and a second idler wheel arranged to engage said wire and feed said wire to said insulation stripping and wire-cutting device, and means for urging said second wheel toward said first wheel so as to enable a wire that is to be incrementally fed, to be engaged between first and second wheels.

38. A system according to claim 37, wherein said incrementally feeding means includes means for controllably urging said second wheel away from said first wheel so as to enable said wire to be fully translatable relative to said first and second wheels.

39. A system according to claim 34, wherein said first mechanism includes means for engaging a wire portion of which has been retained in said channel and for placing the engaged wire in tension and thereafter releasing the tension on said wire so as to preshape said wire to facilitate its installation along the bottom floor of a non-linear path traversing intersecting channels of said grid structure.

40. A system according to claim 34, wherein said second mechanism includes a wheel supported for rolling engagement with said wire, and wherein said system includes means for positioning said wheel relative to said support structure, so that as further wire is drawn from said wire feed mechanism, said wheel is positioned to install said further wire along the bottom floor of said channel.

41. A system according to claim 40, wherein said second mechanism comprises a foot element for urging a first portion of said wire into a first, strand receiving region of said channel, and wherein said wheel positioning means includes means for alternately bringing one of said wheel and said foot element into engagement with wire that has been fed to said channel, while retracting the other of said wheel and said foot from wire that has been fed to said channel.

42. A system according to claim 41, wherein said fifth means includes a translatable cam device supporting said wheel and said foot for movement relative to said channel.

43. A system for installing a segment of insulation-clad wire in a waffleline plate comprised of a two-dimensional periodic conductive structure containing a matrix of wire-supporting intersecting channels, said channels being defined by sidewalls and a floor, said sidewalls extending from a top surface of said plate to said floor, comprising:
an X-Y table upon which said waffleline plate is placed for two-dimensional translation thereby;
a first, wire feed, stripping and severing mechanism arranged adjacent to said X-Y table and being displaceable toward and away from said X-Y table and a waffleline plate supported thereby, said first mechanism including an insulating stripping wire cutting device positioned adjacent to a waffleline plate mounted on said X-Y table and including means for feeding insulation-clad wire to said device by way of which a wire is directed into a first channel of said waffleline plate; and
a second, wire installing mechanism arranged adjacent to said X-Y table so that a waffleline plate supported thereby may be two-dimensionally displaced relative to said second mechanism, said second mechanism including means for causing a first portion of wire directed by way of said device into said first channel of said waffleline plate to be retained therein and for causing a second portion of said wire to be drawn from said first mechanism and installed along the floor of said first channel as said X-Y table is translated.

44. A system according to 43, wherein said first mechanism includes means for engaging a wire portion of which has been retained in said first channel and for preshaping said wire to facilitate its installation in a second channel, which intersects said first channel.

* * * * *